(12) United States Patent
Takahashi et al.

(10) Patent No.: US 7,686,204 B2
(45) Date of Patent: Mar. 30, 2010

(54) WIRE BONDING APPARATUS, RECORD MEDIUM STORING BONDING CONTROL PROGRAM, AND BONDING METHOD

(75) Inventors: Kuniyuki Takahashi, Musashimurayama (JP); Shinsuke Tei, Musashimurayama (JP); Noriko Suzuki, Tachikawa (JP); Noriko Mori, Musashimurayama (JP); Shinji Maki, Hachioji (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 642 days.

(21) Appl. No.: 11/645,943

(22) Filed: Dec. 27, 2006

(65) Prior Publication Data

US 2007/0187138 A1  Aug. 16, 2007

(30) Foreign Application Priority Data

Dec. 28, 2005  (JP)  .............................. 2005-378440

(51) Int. Cl.
 *B23K 31/02* (2006.01)
 *B23K 37/00* (2006.01)
(52) U.S. Cl. ............................. 228/103; 228/4.5; 228/8; 228/105; 228/180.5
(58) Field of Classification Search ........................ None
 See application file for complete search history.

(56) References Cited

U.S. PATENT DOCUMENTS

| | | | | |
|---|---|---|---|---|
| 4,555,052 A * | 11/1985 | Kurtz et al. | ................. | 228/104 |
| 4,597,519 A * | 7/1986 | Kurtz et al. | ................. | 228/102 |
| 4,603,802 A * | 8/1986 | Kurtz et al. | ................. | 228/1.1 |
| 4,815,001 A * | 3/1989 | Uthe et al. | ................. | 700/212 |
| 4,998,664 A * | 3/1991 | Gibson et al. | ............... | 228/102 |
| 5,170,062 A * | 12/1992 | Miyahara | ................ | 250/559.07 |
| 5,213,249 A * | 5/1993 | Long et al. | ................ | 228/102 |
| 5,433,369 A * | 7/1995 | Okumura | ................ | 228/110.1 |
| 5,458,280 A * | 10/1995 | Nishimaki et al. | .......... | 228/102 |
| 5,615,821 A * | 4/1997 | Sasano | ....................... | 228/102 |
| 5,988,482 A * | 11/1999 | Sasakura et al. | ........... | 228/103 |
| 6,085,962 A * | 7/2000 | Jacobson et al. | ............ | 228/103 |
| 6,179,197 B1 * | 1/2001 | Toner | ......................... | 228/102 |
| 6,492,828 B2 * | 12/2002 | Ming-Hsun et al. | ......... | 324/763 |
| 2001/0004991 A1 * | 6/2001 | Mochida et al. | ............. | 228/103 |
| 2001/0016786 A1 * | 8/2001 | Takahashi et al. | ........... | 700/195 |
| 2001/0042772 A1 * | 11/2001 | Narita et al. | .................. | 228/41 |
| 2003/0178469 A1 * | 9/2003 | Hess et al. | .................. | 228/103 |
| 2005/0284914 A1 * | 12/2005 | Beatson et al. | ............... | 228/4.5 |

FOREIGN PATENT DOCUMENTS

JP           55111143 A   *  8/1980

(Continued)

*Primary Examiner*—Kiley Stoner
(74) *Attorney, Agent, or Firm*—William L. Androlia; H. Henry Koda

(57) ABSTRACT

A wire bonding apparatus including a bonding control section provided with an electrical non-bonding detector, an optical non-bonding detector, and an optical shape detector, which are for detecting non-bonding between a first bonding point and a bonding wire; and when non-bonding is detected by the electrical non-bonding detector and non-bonding is also detected by the optical non-bonding detector, then the tip end of the bonding wire is reformed by, based on the shape of the tip end of the bonding wire detected by the optical shape detector, a ball formation device into a ball of a prescribed shape, and rebonding is performed at the first bonding point.

6 Claims, 14 Drawing Sheets

FOREIGN PATENT DOCUMENTS

| | | |
|---|---|---|
| JP | 2-298874 | 12/1990 |
| JP | 3-17376 | 3/1991 |
| JP | 6-5651 | 1/1994 |
| JP | 7-94545 | 4/1995 |
| JP | 2003-163243 | 6/2003 |

* cited by examiner

WIRE BONDING APPARATUS, RECORD MEDIUM STORING BONDING CONTROL PROGRAM, AND BONDING METHOD

BACKGROUND OF THE INVENTION

The present invention relates to a wire bonding apparatus, a bonding control program, and a bonding method for performing recovery processing after detecting non-bonding.

One of the assembly processes for semiconductors such as ICs (integrated circuits) is a wire bonding process for connecting between a semiconductor chip and a lead frame with wires.

In a typical wire bonding process, as seen from FIG. 15, pads 3 (first bonding points) of a semiconductor chip 2 and leads 4 (second bonding points) of a lead frame 15, both on a work 14, are connected by wires 12. FIG. 12 shows a structure of a conventional wire bonding apparatus, FIG. 13 is a flowchart of the bonding steps taken in this wire bonding apparatus, and FIG. 14 shows the bonding steps in conventional bonding process. This conventional wire bonding apparatus and process will be described below with reference to FIGS. 12 to 15.

In the wire bonding apparatus 100, as shown in FIG. 12, a bonding head 19 is set up on an XY table 20; and a bonding arm 13, moved in a Z direction by a motor, is provided on the bonding head 19; and in addition, a capillary 16 is attached to the tip end of the bonding arm 13.

The XY table 20 and the bonding head 19 make a moving mechanism 18. The moving mechanism 18, by the XY table 20, moves the bonding head 19 to any position in a horizontal plane (in the XY plane), and, by moving the bonding arm 13 attached thereto in the Z direction, the capillary 16 at the tip end of the bonding arm 13 is moved freely in the XYZ directions. A wire 12 is made to pass through the tip end of the bonding arm 13. The wire 12 is wound on a spool 11. To the wire 12 wound on the spool 11, an electrical conduction state acquisition device 22 is connected so as to acquire the electrical conduction state between the wire 12 and the work 14 by applying to and measuring electric current or electric voltage between the wire 12 and the work 14. To the bonding head 19, a clamper 17, that moves in the Z direction together with the capillary 16 and secures the wire 12, is attached so that it can freely open and close. To the bonding head 19, moreover, a position detection camera 128 for verifying the position of the semiconductor chip 2 is attached. Also, in the vicinity of the tip end of the wire 12, a ball formation device 26 (called electric torch or electric flame off probe) is attached for effecting electrical discharges between the wire 12 and forming a ball 5 at the tip end of the wire 12. The position detection camera 128 is connected to a position detection camera interface 140, the electrical conduction state acquisition device 22 is connected to an electrical conduction state acquisition device interface 42, the moving mechanism 18 is connected to a moving mechanism interface 44, and the ball formation device 26 (electric torch) are connected to a ball formation device interface 46. Each interface is in turn connected via a data bus 32 to a control section 30 within a computer 31 for controlling the wire bonding apparatus. To the data bus 32, furthermore, a memory unit 34 is connected for storing control data. The above-described wire bonding apparatus is disclosed in, for instance, Japanese Patent Application Unexamined Publication Disclosure No. 2003-163243.

The wire bonding apparatus 100 is controlled by the computer 31 and performs wire bonding with the following steps.

(1) The tip end of a wire 12 is formed into a ball 5 by the ball formation device 26, the position of the semiconductor chip 2 is detected by the position detection camera 128, and the capillary 16 is moved over a pad 3 (first bonding point) by the moving mechanism 18 (step S901 in FIG. 13, step (a) in FIG. 14).

(2) The capillary 16 is then caused to descend, and bonding is performed on the pad 3 (first bonding point) (step S902 in FIG. 13, step (b) in FIG. 14). The ball 5 is pressure-bonded on the pad 3 (first bonding point), so that a first bond portion 6 (pressure bonded ball) is formed.

(3) The moving mechanism 18 causes the capillary 16 to ascend from the pad 3 (first bonding point) and then moves the capillary 16 laterally (step S903 in FIG. 13, step (c) in FIG. 14).

(4) During the movement of the capillary 16, an electric current is made to flow from the wire 12 to the work 14 by the electrical conduction state acquisition device 22, and the electrical conduction state at that time is acquired by the electrical conduction state acquisition device 22. The acquired data are input to the control section 30 via the electrical conduction state acquisition device interface 42 (step S904 in FIG. 13, step (c) in FIG. 14). When the bonding to the pad 3 (first bonding point) is successful and bonding has been performed well, then an electric current is made to flow from the wire 12 to the work 14 in step (c).

(5) In the case of non-bonding (in the case that wire 12 is not bonded to the work 14), no first bond 6 is formed on the pad 3 (first bonding point), and the capillary 16 will ascend and move with the wire 12 at the tip end of the capillary 16 not connected to the pad 3 (first bonding point); as a result, no current will flow from the wire 12 to the work 14. It is thereby made possible to detect wire non-bonding. Acquired data on the electrical conduction state between the wire 12 and the work 14 are processed in the electrical non-bonding detection step by the control section 30, and whether non-bonding has occurred is determined (step S905 in FIG. 13, step (c') in FIG. 14) (see Japanese Patent Application Unexamined Publication Disclosure Nos. H2 (1990)-298874 and H7 (1995)-94545, for instance).

(6) When it is determined in the electrical non-bonding detection step that non-bonding has occurred, the capillary 16 continues as before to move to a lead 4 (second bonding point), bonding is performed at the lead 4 (second bonding point), and, after causing the capillary 16 to ascend, the wire 12 is cut (steps S906 to S908 in FIG. 13). No electrical conduction state acquisition is, however, made for detecting a no-tail or lead non-bonding at the lead 4 (second bonding point).

(7) When wire cutting is finished, error processing is effected by a pad 3 (first bonding point) non-bonding signal, and the wire bonding apparatus 100 is stopped (step S909 in FIG. 13).

(8) Meanwhile, after bonding to the pad 3 (first bonding point), the moving mechanism 18 moves the capillary 16 to the lead 4 (second bonding point) and performs bonding at the lead 4 (second bonding point). If it is determined in the electrical non-bonding detection step that the pad 3 is not non-bonding (bonding on the pad 3 is successful), then when the capillary 16 is made to ascend thereafter, a current is made to flow from the wire 12 to the work 14 by the electrical conduction state acquisition device 22, and the electrical conduction state is acquired by the electrical conduction state acquisition device 22. When bonding to the lead 4 (second bonding point) is successful, and a tail wire 8 is formed properly at the tip end of the capillary 16, a current is able to flow from the wire 12 to the work 14. Conversely, if the wire 12 is accidentally cut while the capillary 16 is ascending, the current from the wire 12 to the work 14 will cease to flow. It is thus possible to detect whether or not the tail wire 8 is a no-tail in which the tail wire 8 fails to attain a prescribed length. Acquired data are input to the control section 30 via the electrical conduction state acquisition device interface 42 (steps S911 and S912 in FIG. 13, step (d) in FIG. 14 to steps (e) and (e')).

(9) After the bonding to the lead 4 (second bonding point), the clamper 17 closes and ascends together with the capillary 16; and, as a result, the wire 12 is cut above a second bond 7 (step (e) to (f)). After this wire cutting also, a current will be made to flow from the wire 12 to the work 14 by the electrical conduction state acquisition device 22, and the electrical conduction state at that time will be acquired by the electrical conduction state acquisition device 22 (steps S913 and S914 in FIG. 13).

(10) If the bonding to the lead 4 (second bonding point) is successful and the cutting of the wire 12 is being properly effected, then when the capillary 16 is ascending, the current that was flowing from the wire 12 to the work 14 will have ceased to flow (step (f) in FIG. 14). When the cutting of the wire 12 is not being properly effected, on the other hand, as in the case that the wire 12 has been peeled away from the work 14, for example, the wire 12 will be electrically connected to the work 14 through the first bond 6, as shown in FIG. 14(f), as a result a current will flow. Moreover, when the current ceases to flow prior to the closing and ascending of the clamper 17, and no current is flowing even after the wire 12 is cut, even though the second bond 7 will have been formed, it will be possible to determine that there is a no-tail with the tail wire 8 not attaining the prescribed length. Thus, by processing the data output from the electrical conduction state acquisition device 22 in an electrical no-tail detection step in the computer 31, it is possible to determine whether the electrical conduction state after bonding to the lead 4 (second bonding point) is a no-tail or a lead non-bonding condition (steps S915 and S917 in FIG. 13) (see Japanese Patent Application Unexamined Publication Disclosure Nos. H2 (1990)-298874 and H7 (1995)-94545, for instance).

(11) When a no-tail or lead non-bonding is detected in the electrical no-tail detection step, by a signal therefrom, the wire bonding apparatus 100 performs error processing and stops (see Japanese Patent Application Laid-Open Disclosure H6 (1994)-5651, for example).

(12) When bonding to the lead 4 (second bonding point) has finished properly, the bonding cycle ends, and the capillary 16 is moved toward the next pad 3 (which is a next first bonding point).

In the above description of the conventional art, wire non-bonding or no-tails are detected by processing signals from the electrical conduction state acquisition device 22 in the control section 30 of the computer 31 and, when it is determined thereby that a non-bonding or no-tail has occurred, then the wire bonding apparatus 100 is stopped. However, during a wire bonding process, various errors, in addition to what is described above, occur, such as the ball not being properly formed due to an electric discharge deficiency, when forming the ball 5 at the tip end of the wire 12 by electric discharge. In such cases also, conventionally, the wire bonding apparatus is stopped when a flaw is detected (see Japanese Patent Application Laid-Open Disclosure Nos. H6 (1994)-5651 and H3 (1991)-17376). Also, in view of the fact that there are cases where an error such as non-bonding or the like is caused when a ball 5 of the prescribed shape is not formed at the tip end of the capillary 16, methods have been proposed in which the wire bonding apparatus is stopped or an anomaly alarm is effected after imaging the shape of the tip end of that wire and processing the resulting data (see Japanese Patent Application Laid-Open Disclosure No. 2003-163243).

In the wire bonding apparatus 100 described in the above-referred art, despite the fact that various non-bonding detection device and methods are provided, when an error such as non-bonding is detected, nothing more is done besides stopping the wire bonding apparatus 100 or issuing a flaw alarm, and the apparatus does not process (correct) the error condition and continue bonding.

To the contrary, Japanese Patent Application Laid-Open Disclosure No. H6 (1994)-5651, for example, discloses that when it is determined by electrically detecting a discharge error that the tip end of the wire 12 is not formed in a prescribed ball shape, abandoning bond is performed at an unnecessary portion of the material being bonded, a ball is reformed, and then bonding is continued. However, with this method, unnecessary wire remains at the abandoning bond position, giving rise to the possibility of short-circuit, which is a problem.

Moreover, as to such errors as non-bonding in pad 3 (first bonding point) and lead 4 (second bonding point) and no-tail, since the situation at the tip end of the wire 12 varies, a simple recovery process such as the abandoning bond described above cannot be effected, and it will always be necessary to stop the whole bonding process and perform recovery process after an operator has verified the situation of the wire 12 and the like. Thus, it is not possible to recover from such errors and continue bonding.

BRIEF SUMMARY OF THE INVENTION

Accordingly, the object of the present invention is to provide a wire bonding apparatus, a bonding control program, and a bonding method in which, when a pad (first bonding point) non-bonding, lead (second bonding point) non-bonding, no-tail, or discharge error or the like occurs, recovery processing is executed without stopping the wire bonding apparatus, continuing bonding actions.

The object of the present invention can be accomplished by a wire bonding apparatus that includes a moving mechanism for moving, in XYZ directions, a capillary having a wire inserted therethrough and executing bonding on a work;

an electrical conduction state acquisition device for detecting an electrical conduction state by allowing an electric current to flow from the wire to the work;

a first means for taking an image of the work;

a light path device for conducting an elevation image of a vicinity of a tip end of the capillary to the first means;

a ball formation device for forming a tip end of the wire into a ball of a prescribed shape; and a computer for controlling wire bonding between a first bonding point and a second bonding point, the computer including a second means for electrically detecting non-bonding between the first bonding point and the wire by processing electrical conduction state signals acquired by the electrical conduction state acquisition device and indicative of electrical conduction state between the first bonding point and the wire, a third means for optically detecting non-bonding between the first bonding point and the wire by processing plane images acquired by the first means, a fourth means for detecting a shape of a tip end of the wire by processing elevation images of the wire in the vicinity of the tip end of the capillary acquired by the first means via the light path device, and a fifth means for, when non-bonding is detected by the second means and non-bonding is detected by the third means, reforming the tip end of the wire into a ball of prescribed shape by the ball formation device, based on the tip end shape of the wire detected by the fourth means, and executing rebonding on the first bonding point.

The above-described wire bonding apparatus can further includes a sixth means for opening and closing a plurality of clampers, respectively, for gripping the wire; and the above-described computer can further includes a seventh means for, when non-bonding is detected by the second means and non-bonding is detected by the third means and a condition of the wire, which is at the tip end of the capillary and detected by the fourth means, is not a prescribed condition, paying out the wire at the tip end of the capillary until the wire at the tip end of the capillary attains a prescribed condition, by an up-and-down movement of the capillary caused by the sixth means and moving mechanism, based on a condition of the wire at the tip end of the capillary detected by the fourth means.

The object of the present invention can be accomplished by a wire bonding apparatus which is characterized in that it includes a moving mechanism for moving, in XYZ directions, a capillary having a wire inserted therethrough and executing bonding on a work;

an electrical conduction state acquisition device for detecting an electrical conduction state by allowing an electric current to flow from the wire to the work;

a first means for taking an image of the work;

a light path device for conducting an elevation image of a vicinity of a tip end of the capillary to the first means;

a ball formation device for forming a tip end of the wire into a ball of a prescribed shape;

a second means for opening and closing a plurality of clampers, respectively, for gripping the wire; and a computer for controlling wire bonding by cutting the wire after bonding between a first bonding point and a second bonding point, and this computer includes a third means for detecting no-tail, in which a tail of the wire fails to have a prescribed length, by processing electrical conduction state signals acquired by the electrical conduction state acquisition device, after bonding to the second bonding point but prior to wire cutting, and indicative of electrical conduction state between a second bonding point and the wire, a fourth means for detecting a shape of a tip end of the wire by processing elevation images of the wire in the vicinity of the tip end of the capillary acquired by the first means via the light path device, a fifth means for, when no-tail is detected by the third means and an output is made from the fourth means to the effect that a condition of the wire at the tip end of the capillary is not a prescribed condition, paying out the wire at the tip end of the capillary until the wire at the tip end of the capillary attains a prescribed condition, by an up-and-down movement of the capillary caused by the second means and moving mechanism, based on a condition of the wire at the tip end of the capillary detected by the fourth means, and a sixth means for reforming the tip end of the wire into a ball of a prescribed shape by the ball formation device based on the tip end shape of the wire detected by the fourth means.

The object of the present invention can be accomplished by a wire bonding apparatus which is characterized in that it includes a moving mechanism for moving, in XYZ directions, a capillary having a wire inserted therethrough and executing bonding on a work;

a first means for taking an image of the work;

a light path device for conducting an elevation image of a vicinity of a tip end of the capillary to the first means;

a ball formation device for forming a tip end of the wire into a ball of a prescribed shape by an electrical discharge between a discharge electrode and the wire;

an electrical discharge state acquisition device for acquiring a state of the electrical discharge between the discharge electrode and the wire;

a second means for opening and closing a plurality of clampers, respectively, for gripping the wire; and a computer for controlling wire bonding between a first bonding point and a second bonding point, and this computer includes a third means for electrically detecting whether the electrical discharge of the ball formation device is normal or not by processing electrical discharge state signals acquired by the electrical discharge state acquisition device during the electrical discharge of the ball formation device and indicative of electrical discharge state between the discharge electrode and the wire, a fourth means for detecting a shape of a tip end of the wire by processing elevation images of the wire in the vicinity of the tip end of the capillary acquired by the first means via the light path device, a fifth means for, when an electrical discharge anomaly is detected by the third means and a condition of the wire at the tip end of the capillary detected by the fourth means is not a prescribed condition, paying out the wire at the tip end of the capillary until the wire at the tip end of the capillary attains a prescribed condition, by an up-and-down movement of the capillary caused by the second means and moving mechanism, based on a condition of the wire at the tip end of the capillary detected by the fourth means, and a sixth means for, when a condition of the wire at the tip end of the capillary detected by the fourth means is a prescribed condition after an electrical discharge anomaly is detected by the third means, reforming the tip end of the wire into a ball of a prescribed shape by the ball formation device based on the tip end shape of the wire detected by the fourth means.

The object of the present invention can be accomplished by a record medium storing a bonding control program for a wire bonding apparatus that bonds a wire between a first bonding point and a second boding point, wherein the wire bonding apparatus includes a moving mechanism for moving, in XYZ directions, a capillary having a wire inserted therethrough and executing bonding on a work, an electrical conduction state acquisition device for detecting an electrical conduction state by allowing an electric current to flow from the wire to the work, a light path device for conducting an elevation image of a vicinity of a tip end of the capillary to an imaging device, a ball formation device for forming a tip end of the wire into a ball of a prescribed shape, and a computer for controlling the wire bonding apparatus; and
the record medium storing a bonding control program is executed by the computer and includes
an electrical non-bonding detection program for electrically detecting non-bonding between the first bonding point and the wire by processing electrical conduction state signals acquired by the electrical conduction state acquisition device and indicative of electrical conduction state between a first bonding point and a wire;
an optical non-bonding detection program for optically detecting non-bonding between a first bonding point and a wire by processing plane images acquired by the imaging device;
an optical shape detection program for detecting a shape of a tip end of the wire by processing elevation images of the wire in the vicinity of the tip end of the capillary acquired by the imaging device via the light path device; and
a non-bonding recovery picogram for, when a non-bonding detection is output by the electrical non-bonding detection program and a non-bonding detection is output by the optical non-bonding detection program, reforming a ball of a prescribed shape at the tip end of the wire by the ball formation device based on the tip end shape of the wire output by the optical shape detection program, and executing rebonding at the first bonding point.

The above-described wire bonding apparatus which is controlled by the above-described bonding control program can further include a clamper operating device for opening and closing a plurality of clampers, respectively, for gripping the wire; and the above-described record medium storing bonding control program can further include a tail re-payout program for, when a non-bonding detection is output by the electrical non-bonding detection program and a non-bonding detection is output by the optical non-bonding detection program and an output is made by the optical shape detection program to the effect that a condition of the wire at the tip end of the capillary is not a prescribed condition, paying out the wire at the tip end of the capillary until the wire at the tip end of the capillary attains a prescribed condition, by an up-and-down movement of the capillary caused by the clamper operating device and moving mechanism, based on a condition of the wire at the tip end of the capillary output by the optical shape detection program.

The object of the present invention can be accomplished by a record medium storing a bonding control program for a wire bonding apparatus that bonds a wire between a first bonding point and a second boding point, wherein the wire bonding apparatus includes
a moving mechanism for moving, in XYZ directions, a capillary having a wire inserted therethrough and executing bonding on a work,
an electrical conduction state acquisition device for detecting an electrical conduction state by allowing an electric current to flow from the wire to the work,
an imaging device for taking an image of the work,
a light path device for conducting an elevation image of a vicinity of a tip end of the capillary to the imaging device,
a ball formation device for forming a tip end of the wire into a ball of a prescribed shape,
a clamper operating device for opening and closing a plurality of clampers, respectively, for gripping the wire, and
a computer for controlling the wire bonding apparatus; and
the record medium storing a bonding control program is characterized in that it is executed by the computer and includes
an electrical no-tail detection program for detecting no-tail, in which a tail of the wire fails to have a prescribed length, by processing electrical conduction state signals acquired by the electrical conduction state acquisition device, after bonding on a second bonding point but prior to wire cutting, and indicative of electrical conduction state between the second bonding point and the wire;
an optical shape detection program for detecting a shape of a tip end of the wire by processing elevation images of the wire in the vicinity of the tip end of the capillary acquired by the imaging device via the light path device;
a tail re-payout program for, when a no-tail detection is output by the electrical no-tail detection program and an output is made by the optical shape detection program to the effect that a condition of the wire at the tip end of the capillary is not a prescribed condition, paying out the wire at the tip end of the capillary until the wire at the tip end of the capillary attains a prescribed condition, by an up-and-down movement of the capillary caused by the clamper operating device and moving mechanism, based on a condition of the wire at the tip end of the capillary output by the optical shape detection program; and
a no-tail recovery program for reforming the tip end of the wire into a ball of a prescribed shape by the ball formation device based on the tip end shape of the wire output by the optical shape detection program.

The object of the present invention can be accomplished by a record medium storing a bonding control program for a wire bonding apparatus that bonds a wire between a first bonding point and a second boding point, wherein the wire bonding apparatus includes
a moving mechanism for moving, in XYZ directions, a capillary having a wire inserted therethrough and executing bonding on a work,
an imaging device for taking an image of the work,
a light path device for conducting an elevation image of a vicinity of a tip end of the capillary to the imaging device,
a ball formation device for forming a tip end of the wire into a ball of a prescribed shape by an electrical discharge between a discharge electrode and the wire,
an electrical discharge state acquisition device for acquiring a state of the electrical discharge between the discharge electrode and the wire,
a clamper operating device for opening and closing a plurality of clampers, respectively, for gripping the wire, and
a computer for controlling the wire bonding apparatus; and
the record medium storing a bonding control program is characterized in that it is executed by the computer and includes
a discharge anomaly electrical detection program for electrically detecting whether the electrical discharge of the ball formation device is normal or not by processing electrical discharge state signals acquired by the electrical discharge state acquisition device during the electrical discharge of the ball formation device and indicative of electrical discharge state between the discharge electrode and the wire,
an optical shape detection program for detecting a shape of a tip end of the wire by processing elevation images of the wire in the vicinity of the tip end of the capillary acquired by the imaging device via light path device, a tail re-payout program for, when an electrical discharge anomaly is output by the discharge anomaly electrical detection program and an output is made by the optical shape detection program to the effect that a condition of the wire at the tip end of the capillary is not a prescribed condition, paying out the wire at the tip end of the capillary until the wire at the tip end of the capillary attains a prescribed condition, by an up-and-down movement of the capillary caused by the clamper operating device and moving mechanism, based on a condition of the wire at the tip end of the capillary output by the optical shape detection program, and a discharge anomaly recovery program for, when an electrical discharge anomaly is output by the discharge anomaly electrical detection program and an output is made by the optical shape detection program to the effect that a condition of the wire at the tip end of the capillary is a prescribed condition, reforming the tip end of the wire into a ball of a prescribed shape by the ball formation device based on the tip end shape of the wire output by the optical shape detection program.

The object of the present invention can be accomplished by a bonding method for a bonding apparatus that bonds a wire between a first bonding point and a second bonding point, and this method is characterized in that it includes the steps of preparing a moving mechanism for moving, in XYZ directions, a capillary having a wire inserted therethrough and executing bonding on a work, an electrical conduction state acquisition device for detecting an electrical conduction state by allowing an electric current to flow from the wire to the work, an imaging device for taking an image of the work, a light path device for conducting an elevation image of a vicinity of a tip end of the capillary to the imaging device, a ball formation device for forming the tip end of the wire into a ball of a prescribed shape, and a computer for controlling the bonding apparatus;

an electrical non-bonding detection step for electrically detecting non-bonding between the first bonding point and the wire by processing electrical conduction state signals acquired by the electrical conduction state acquisition device and indicative of electrical conduction state between the first bonding point and the wire;

an optical non-bonding detection step for optically detecting non-bonding between the first bonding point and the wire by processing plane images acquired by the imaging device;

an optical shape detection step for detecting a shape of a tip end of the wire by processing elevation images of the wire in the vicinity of the tip end of the capillary acquired by the imaging device via the light path device; and a non-bonding recovery step for, when non-bonding is detected in the electrical non-bonding detection step and non-bonding is detected in the optical non-bonding detection step, reforming the tip end of the wire into a ball of a prescribed shape by the ball formation device, based on the tip end shape of the wire detected in the optical shape detection step, and executing rebonding on the first bonding point.

The above-described wire bonding apparatus in which the above-described bonding method is employed can further include a clamper operating device for opening and closing a plurality of clampers, respectively, for gripping the wire; and the above-described bonding method can further include a tail re-payout step for, when non-bonding is detected in the electrical non-bonding detection step and non-bonding is detected in the optical non-bonding detection step and a condition of the wire at the tip end of the capillary detected in the optical shape detection step is not a prescribed condition, paying out the wire at the tip end of the capillary until the wire at the tip end of the capillary attains a prescribed condition by an up-and-down movement of the capillary caused by the clamper operating device and moving mechanism based on a condition of the wire at the tip end of the capillary detected in the optical shape detection step.

The object of the present invention can be accomplished by a bonding method for a bonding apparatus that bonds a wire between a first bonding point and a second bonding point, and this method is characterized in that it includes the steps of preparing a moving mechanism for moving, in XYZ directions, a capillary having a wire inserted therethrough and executing bonding on a work, an electrical conduction state acquisition device for detecting an electrical conduction state by allowing an electric current to flow from the wire to the work, an imaging device for taking an image of the work, a light path device for conducting an elevation image of a vicinity of a tip end of the capillary to the imaging device, a ball formation device for forming the tip end of the wire into a ball of a prescribed shape, a clamper operating device for opening and closing a plurality of clampers, respectively, for gripping the wire, and a bonding control computer for controlling the bonding apparatus;

an electrical no-tail detection step for detecting no-tail in which a tail of the wire fails to have a prescribed length by processing electrical conduction state signals acquired by the electrical conduction state acquisition device, after bonding to the second bonding point but prior to wire cutting, and indicative of electrical conduction state between the second bonding point and the wire;

an optical shape detection step for detecting a shape of a tip end of the wire by processing elevation images of the wire in the vicinity of the tip end of the capillary acquired by the imaging device via the light path device;

a tail re-payout step for, when a no-tail is detected in the electrical no-tail detection step and a condition of the wire at the tip end of the capillary detected in the optical shape detection step is not a prescribed condition, paying out the wire at the tip end of the capillary until the wire at the tip end of the capillary attains a prescribed condition, by an up-and-down movement of the capillary caused by the clamper operating device and moving mechanism, based on a condition of the wire at the tip end of the capillary detected in the optical shape detection step; and a no-tail recovery step for reforming the tip end of the wire into a ball of a prescribed shape by the ball formation device based on the tip end shape of the wire detected in the optical shape detection step.

The object of the present invention can be accomplished by a bonding method for a bonding apparatus that bonds a wire between a first bonding point and a second bonding point, and this method is characterized in that it includes the steps of preparing a moving mechanism for moving, in XYZ directions, a capillary having a wire inserted therethrough and executing bonding on a work, an imaging device for taking an image of the work, a light path device for conducting an elevation image of a vicinity of a tip end of the capillary to the imaging device, a ball formation device for forming a tip end of the wire into a ball of a prescribed shape by an electrical discharge between a discharge electrode and the wire, an electrical discharge state acquisition device for acquiring a state of the electrical discharge between the discharge electrode and the wire, and a clamper operating device for opening and closing a plurality of clampers, respectively, for gripping the wire;

a discharge anomaly electrical detection step for electrically detecting whether the electrical discharge of the ball formation device is normal or not by processing electrical discharge state signals acquired by the electrical discharge state acquisition device during the electrical discharge of the ball formation device and indicative of electrical discharge state between the discharge electrode and the wire;

an optical shape detection step for detecting a shape of a tip end of the wire by processing elevation images of the wire in the vicinity of the tip end of the capillary acquired by the imaging device via the light path device;

a tail re-payout step for, when an electrical discharge anomaly is detected in the discharge anomaly electrical detection step and a condition of the wire at the tip end of the capillary detected in the optical shape detection step is not a prescribed condition, paying out the wire at the tip end of the capillary until the wire at the tip end of the capillary attains a prescribed condition, by an up-and-down movement of the capillary caused by the clamper operating device and moving mechanism, based on a condition of the wire at the tip end of the capillary detected in the optical shape detection step; and a discharge anomaly recovery step for, when an electrical discharge anomaly is detected in the discharge anomaly electrical detection step and a condition of the wire at the tip end of the capillary detected in the optical shape detection step is a prescribed condition, reforming the tip end of the wire into a ball of a prescribed shape by the ball formation device based on the tip end shape of the wire detected in the optical shape detection step.

With the wire bonding apparatus, the bonding control program, and the bonding method of the present invention, when a pad (first bonding point) non-bonding, lead (second bonding point) non-bonding, no-tail, or discharge error or the like occurs, recovery processing is executed without stopping the wire bonding apparatus, and bonding is continued.

DETAILED DESCRIPTION OF THE INVENTION

Embodiments of the present invention will be described below. In the following descriptions, the same symbols are used for the portions that are the same as those described above relative to the conventional art, and no further description thereof will be given.

First Embodiment

Figure 1:
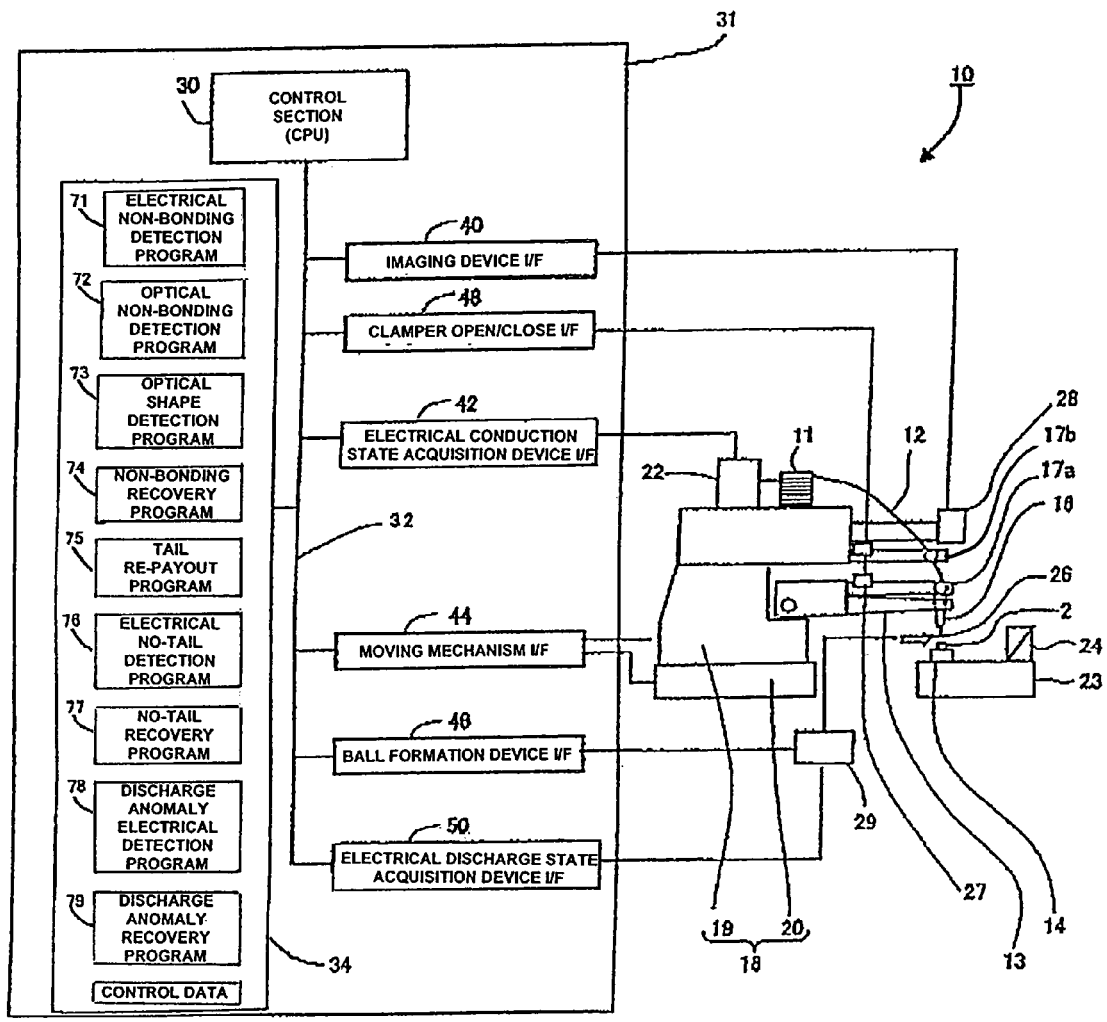
FIG. 1 is a schematic view of the control system of the wire bonding apparatus of the present invention.

The wire bonding apparatus 10 of the First Embodiment of the present invention is shown in FIG. 1. The wire bonding apparatus 10 comprises, instead of the position detection camera 128 of the conventional wire bonding apparatus 100, an imaging device 28 that is capable of not only detecting a position but also imaging a work; and the wire bonding apparatus 10 further includes two clampers, namely a first clamper 17a and a second clamper 17b, that are opened and closed, respectively, by a clamper operating device 27. This clamper operating device is disclosed in the allowed claims of U.S. Pat. No. 5,323,948 (The disclosure of the claims of this patent is incorporated by reference). The clamper operating device operates a pair of (two) clamping arms of each one of the first and second clampers, each holding a bonding wire between the clamping arms; and at least one of the clamping arms is operated (opened and closed) by electric strain effect or magnetic strain effect of a piezoelectric element. Such at least one clamping arm can be operated by a solenoid, and it can be further operated by a linear motor. The first clamper 17a is movable in the Z direction together with the capillary 16, while the second clamper 17b is fixed to the bonding head 19.

The wire bonding apparatus 10 additionally includes a light path device 24 for conducting a plane image of the vicinity of the tip end of the capillary 16 to the imaging device 28 and an electrical discharge state acquisition device 29 for acquiring the state of electrical discharges between a discharge electrode and the wire 12.

The imaging device 28 is connected to the imaging device interface 40, the clamper operating device 27 is connected to the clamper open/close interface 48, the electrical discharge state acquisition device 29 is connected to the electrical discharge state interface 50, and the interfaces are respectively connected via the data bus 32 to the control section 30. The first clamper 17a is moved in Z direction together with the capillary 16, and the second clamper 17b is secured to the bonding head 19. Furthermore, the computer 31 includes an imaging device interface 40, a clamper open/close interface 48, an electrical conduction state acquisition device interface 42, a moving mechanism interface 44, a ball formation device interface 46, an electrical discharge state acquiring interface 50, a memory unit 34, a data bus 32 and a control section 30. The memory unit 34 of the present invention includes both internal memory section and external memory section, in which the internal memory section has a function to, among others, store, read-out and write-in the control data, and the external memory section functions as a computer readable medium.

Figure 2:
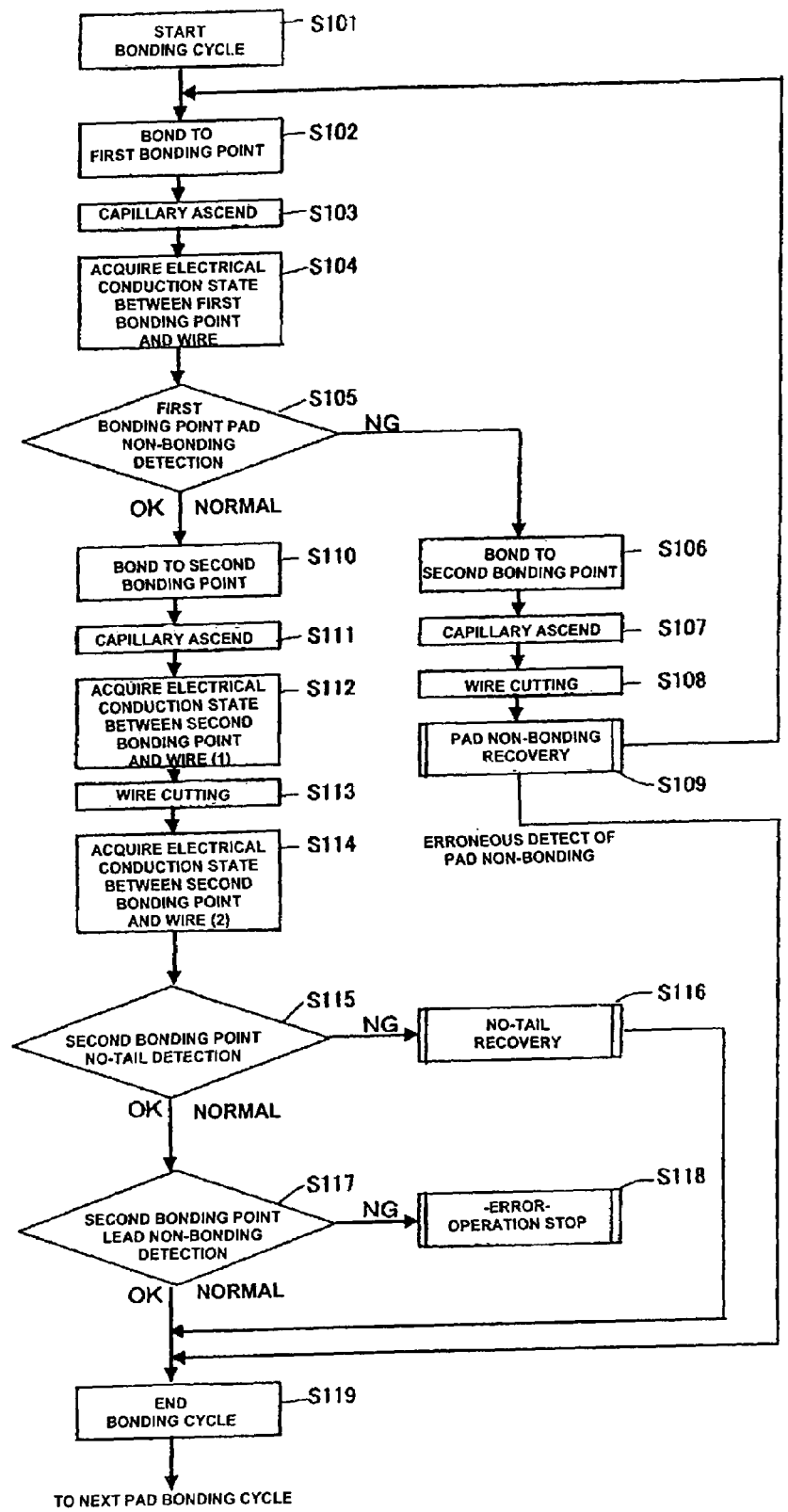
FIG. 2 is a flowchart of the overall recovery process in the present invention.
Figure 6:
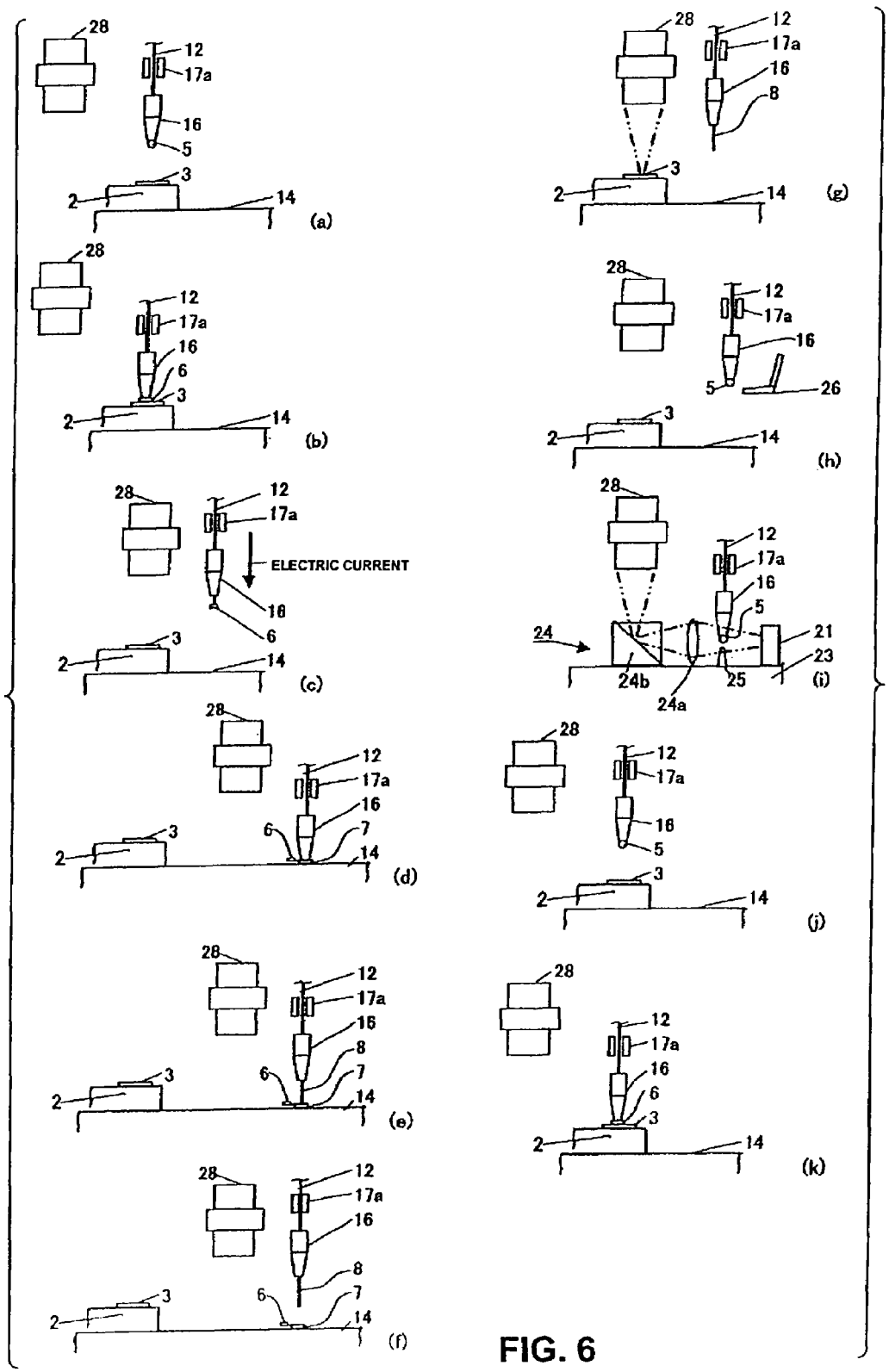
FIG. 6 shows the steps (a) to (k) of the pad non-bonding recovery process in the present invention.

The wire bonding apparatus 10 structured as described above is controlled by the computer 31 and performs bonding and recovery actions or processes, when non-bonding of a pad 3 (first bonding point) occurs, with the steps described below:

(1) Bonding to the pad 3 (first bonding point), and non-bonding detection, are performed by the same methods and steps as those described relative to the conventional art (steps S101 to S105 in FIG. 2, steps (a) to (c) in FIG. 6).

(2) Even when non-bonding of the pad 3 (first bonding point) is detected by the electrical non-bonding detection program 71 that processes a signal from the electrical conduction state acquisition device 22 by the control section 30 of the computer 31, the capillary 16 continues as before to move to the lead 4 (second bonding point) and performs bonding at the lead 4 (second bonding point) (step S106 in FIG. 2, step (d) in FIG. 6). However, no acquisition of the electrical conduction state is made in order to detect a no-tail condition or lead non-bonding condition at the lead 4 (second bonding point). More specifically, the electrical conduction state acquisition device 22 involves resistance or impedance (not shown) therein, and the electrical non-bonding detection program 71 causes the control section 30 to compare A/D-converted data with no-bonding reference data stored in advance in the memory unit 34; and when the A/D-converted data is out of the range of the non-bonding reference data, then the electrical non-bonding detection program 71 determines the non-bonding. The above-described A/D-converted data is obtained by the electrical conduction state acquisition device 22 that applies direct voltage or alternate current from the wire to the work, for detecting non-bonding, and converts the difference in the electrical potentials generated, relatively, in the resistance or impedance and then A/D-converts the difference in the electrical potentials into an A/D-converted data via the electrical conduction state acquisition device interface 42.

(3) After bonding to the lead 4 (second bonding point), the capillary 16 is made to ascend, and the tail 8 of the wire (or the tail wire 8) is extended; and after which the first clamper 17a is closed and made to ascend together with the capillary 16, and the wire 12 is cut (steps S106 to S108 in FIG. 2, steps (e) to (f) in FIG. 6). By this bonding action to the lead 4 (second bonding point), a tail wire 8 is made in which ball formation at the tip end of the capillary 16 is possible.

(4) When non-bonding of the pad 3 (first bonding point) is detected by executing the electrical non-bonding detection program 71, the control section 30 of the computer 31 issues a command to execute the non-bonding recovery program 74 for pad. By that command, a process of pad non-bonding recovery S109 by the non-bonding recovery program 74 for pad is started.

Figure 3:
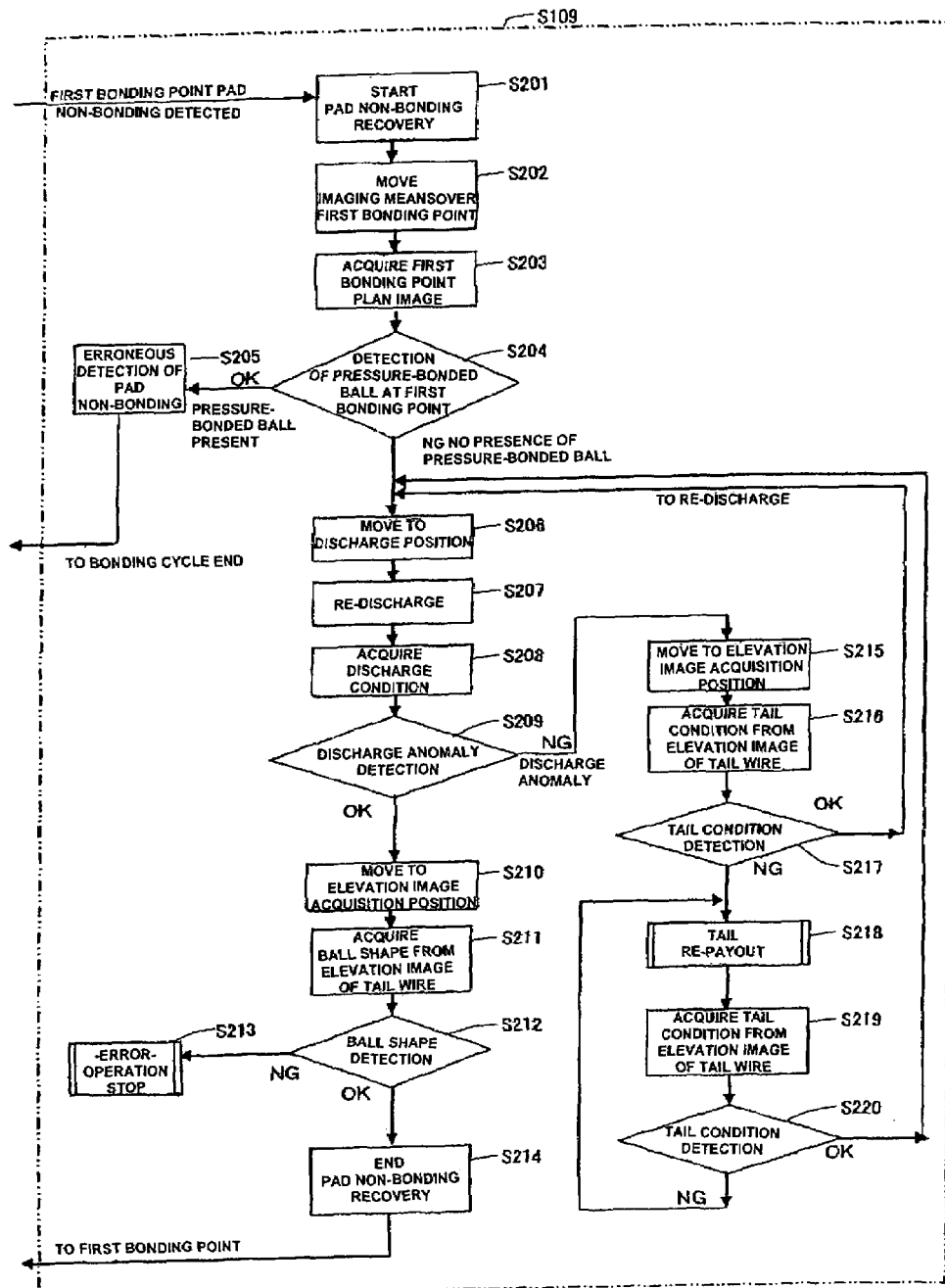
FIG. 3 is a flowchart of the pad non-bonding recovery process in the present invention.

(5) When the process S109 by the non-bonding recovery program 74 for pad is started, the computer 31 moves the imaging device 28, which is comprised of a camera including digital image sensors, such as CCD (charge-coupled device) cameras, CMOS (complementary metal-oxide semiconductor) cameras, etc., by the moving mechanism 18, to a position at which the pad 3 (first bonding point) enters the visual field 60 thereof (i.e. of the imaging device 28) (step S202 in FIG. 3). Then, a plane image of the vicinity of the pad 3 (first bonding point) where the non-bonding was detected is acquired (step S203 in FIG. 3, step (g) in FIG. 6). The acquired plane image is input to the control section 30 via the imaging device interface 40, and that image is analyzed (step S204 in FIG. 3).

Figure 10A:
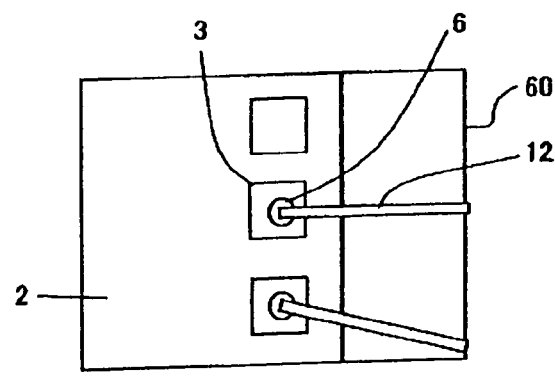
FIGS. 10A and 10B show plane images of a pad unit acquired by the plane image acquisition device in the present invention.
Figure 10B:
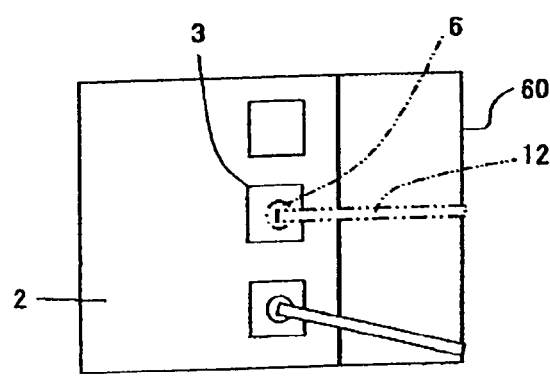

Examples of acquired plane images are shown in FIGS. 10A and 10B. FIG. 10A shows the condition where bonding has been done properly, while FIG. 10B shows non-bonding. In both FIGS. 10A and 10B, bonding is done from below in the visual field 60 upward, with the lower pad being a pad where bonding has been already finished normally, the middle pad 3 being the pad 3 (first bonding point) where bonding is being done, and the uppermost pad being an unbonded pad. In FIG. 10A, a first bond 6 (pressure-bonded ball) formed by pressure bonding on the middle pad can be seen, but in FIG. 10B the first bond (pressure-bonded ball) cannot be seen on the pad 3. By processing such a plane image by the optical non-bonding detection program of the computer 31, it is possible to detect whether or not the first bond 6 (pressure-bonded ball) actually has been formed and bonding has been performed. Non-bonding detection can be done by determining whether the first bond 6 (pressure-bonded ball) is there or not by the optical non-bonding detection program of the computer 31, or non-bonding detection processing can be performed by first storing shape data on the first bond (pressure-bonded ball) in the memory unit 34, and then comparing that data by the optical non-bonding detection program 72. The optical non-bonding detection program 72, more specifically, causes the control section 30 to compare the data in which the image of the pad 3 obtained from the imaging device 28 is converted into image measured values via the imaging device interface 40 and the reference data on the pad 3 stored in advance in the memory unit 34; and when the data converted into the image measured values is unmatched with the reference data, the optical non-bonding detection program 72 determines non-bonding of the pad 3.

(6) When it is determined by executing the optical non-bonding detection program 72 that the pad 3 (first bonding point) is non-bonding, the computer 31 moves the capillary 16, by the moving mechanism 18, to the discharge position for redoing ball formation by electrical discharge (step S206 in FIG. 3, step (h) in FIG. 6).

(7) Once moved to the discharge position, an electrical discharge is effected between the tail wire 8 and the discharge electrode of a ball formation device 26, so that the tip end of the tail wire 8 is formed into a ball shape. The shape of the ball formed by electrical discharge is determined by the amount of electrical charge applied to the tail wire 8 by the electrical discharge (or discharge). The charge amount can be found as the integral of the discharge current, for example, and for detecting whether or not electrical discharge has been effected properly when that value becomes a prescribed value. In addition, the same results can be obtained by way of detecting discharge voltage by a voltage divider. The electrical discharge state acquisition device 29 acquires at least one of or both of electric current conditions at the time of electrical discharge such as discharge current and electric voltage conditions at the time of electrical discharge such as discharge voltage as described above. Those acquired data are input in the control section 30 by the electrical discharge state interface 50 and subjected to comparison processing with the data in the memory unit 34 by executing the discharge anomaly electrical detection program 78; and then a determination is made as to whether a discharge anomaly is occurred or not (steps S207 to S209 in FIG. 3). The discharge anomaly electrical detection program 78 executes, for a predetermined period of time, sampling of the discharge voltage values and discharge current values from the discharge circuit (not shown) installed in the ball formation device 26. The sampled discharge voltage values and discharge current values are A/D-converted into measured discharge values via the discharge state interface 50 from the electrical discharge state acquisition device 29 and read-in by the control section 30. Then, the discharge anomaly electrical detection program 78 causes the control section 30 to compare the measured discharge voltage data and measured discharge current data with the reference discharge voltage data and reference discharge current data, respectively; and when the measured discharge voltage data and measured discharge current data are, respectively, out of the range of the reference discharge voltage data and reference discharge current data, then the discharge anomaly electrical detection program 78 determines the discharge anomaly.

(8) When no discharge anomaly is detected by the discharge anomaly electrical detection program, and it is determined that electrical discharge has been normally effected, then the computer 31 moves the tip end of the capillary 16, by the moving mechanism 18, to an elevation image acquisition position where the light path device 24 is provided (step S210 in FIG. 3). A reference member 25 is attached to a base 23 at an elevation image acquisition position.

Figure 11A:
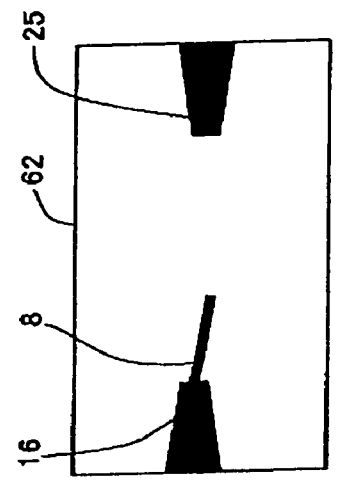
FIGS. 11A through 11E show the elevation images of the vicinity of the tip end of a wire.
Figure 11B:
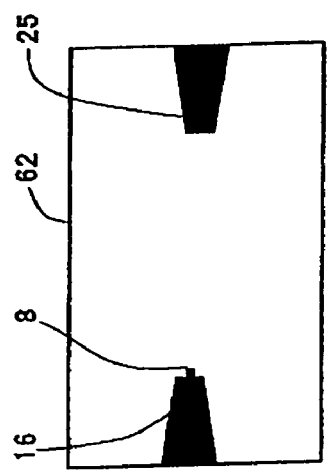
Figure 11C:
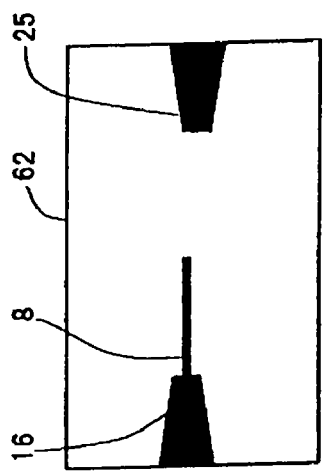
Figure 11D:
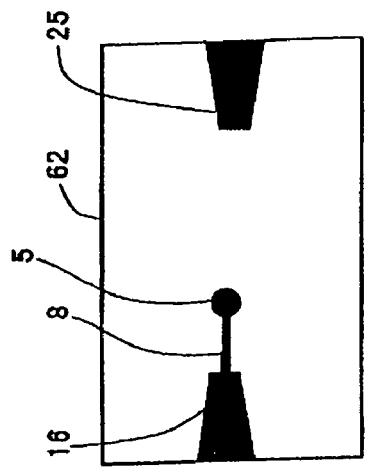
Figure 11E:
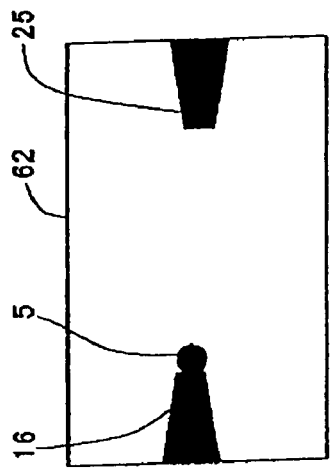
Figure 12:
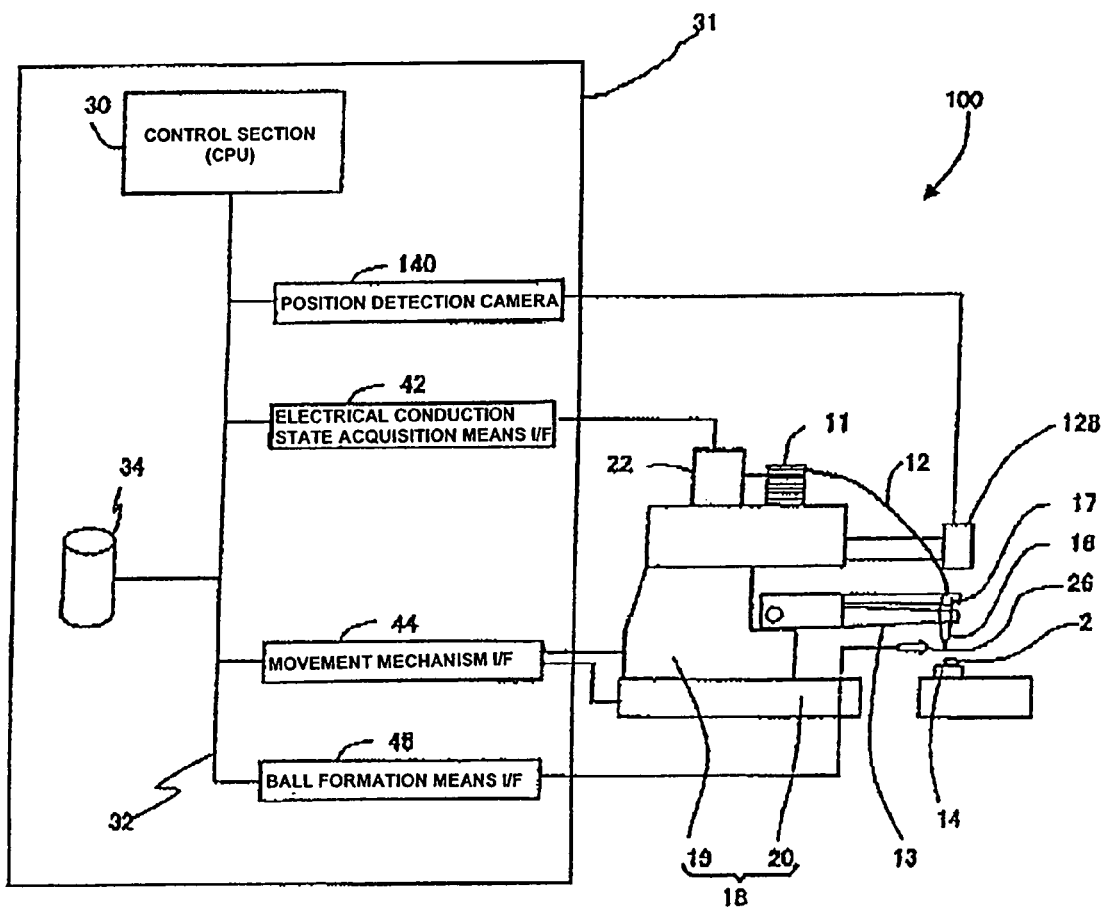
FIG. 12 is a schematic view of a conventional wire bonding apparatus.
Figure 13:
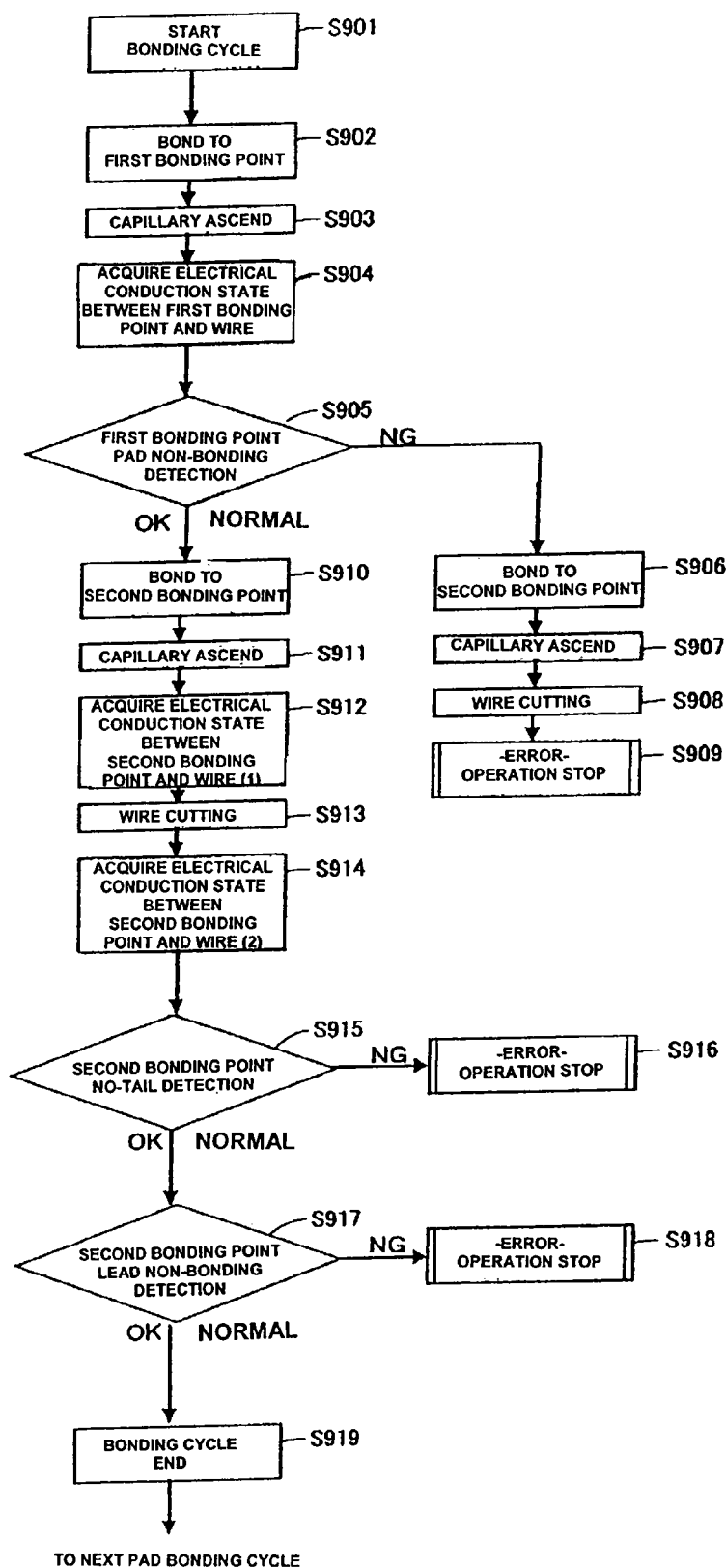
FIG. 13 is a flowchart of the overall wire bonding process in the conventional wire bonding apparatus.
Figure 14:
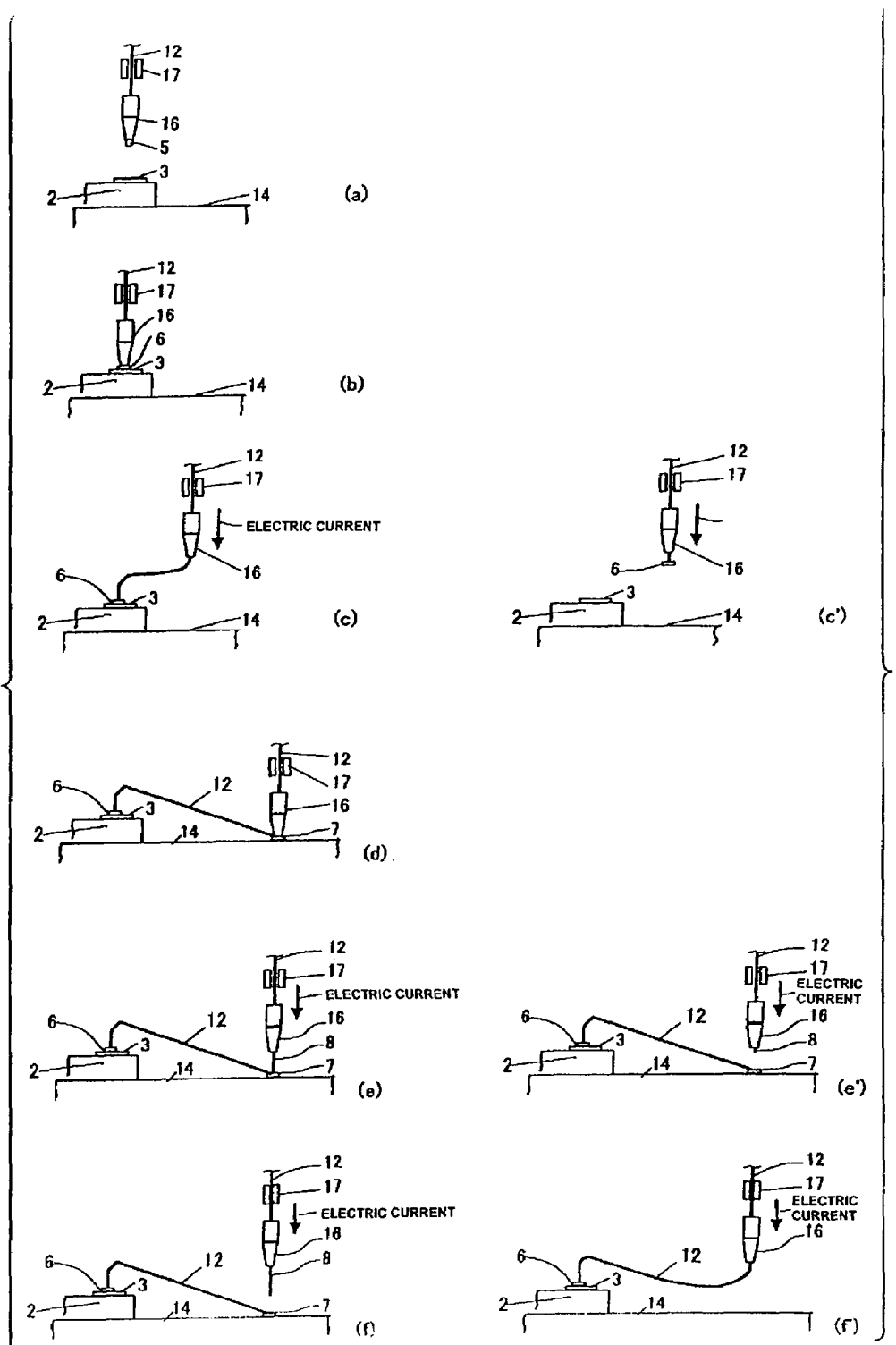
FIG. 14 shows the steps (a) to (f) of the wire bonding actions in the conventional wire bonding apparatus.
Figure 15:
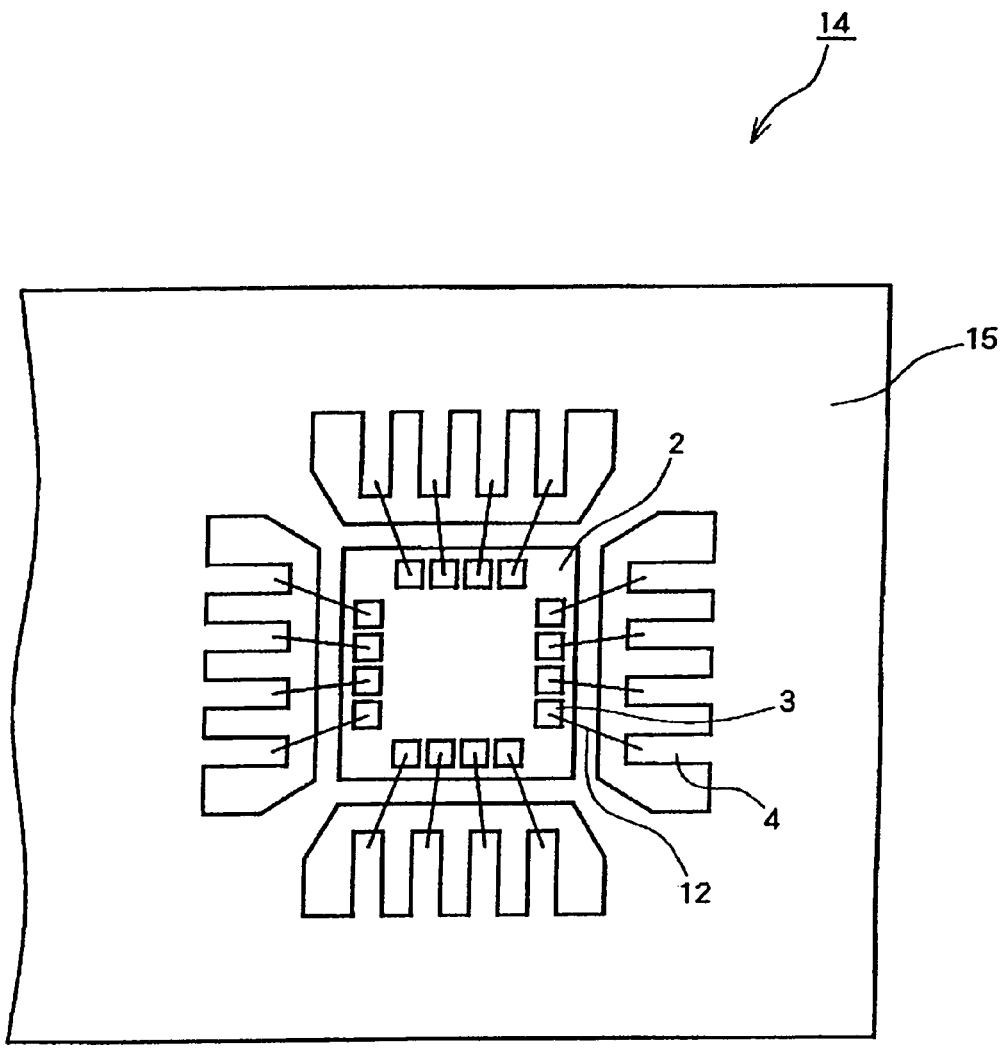
FIG. 15 is a top view of a semiconductor chip wire-bonded to a lead frame.

(9) At the elevation image acquisition position, the tip end of the capillary 16 is illuminated, together with the reference member 25, by a light emitter 21 (see step (i) in FIG. 6) such as a light-emitting diode, from the side surface of the capillary 16 to form an elevation image. The elevation image formed is conducted to the imaging device 28 by the light path device 24 made of a lens 24a and prism 24b. The imaging device 28 acquires this elevation image of the tip end of the capillary 16 and inputs it to the control section 30 from the imaging device interface 40 (step S211 in FIG. 3, step (i) in FIG. 6). The input elevation image is processed by executing the optical shape detection program 73 of the computer 31; and a determination is made as to whether or not the diameter of the ball 5 formed is a prescribed diameter (step S212 in FIG. 3). When the ball 5 is formed, the acquired elevation image includes the capillary 16, ball 5, tail wire 8, and reference member 25 contained in the visual field 62, as shown in FIGS. 11D and 11E. It can be possible that the control section 30, based on the results of a calibration of the relationship between the number of pixels found in advance and the length of the object(s) in the visual field, finds the ball diameter from the number of pixels in the ball 5 portion of the image, or provision can be made so that the relative length with the reference numeral captured in the visual field 62 together is found, and the ball diameter is found from that relationship. Then, the ball diameter acquired by executing the optical shape detection program 73 is compared with prescribed standard range data stored in the memory unit 34, and a determination is made as to whether or not the ball diameter is within the prescribed standard range (step S212 in FIG. 3, step (i) in FIG. 6). The optical shape detection program 73 causes the control section 30 to compare the data of the elevation image of the wire tail 8 obtained from the imaging device 28 and converted into image measured values via the imaging device interface 40 with the elevation image reference data stored in advance in the memory unit 34; and when the data converted into image measured values is unmatched with the elevation image reference data, then optical shape detection program 73 determines the non-bonding.

(10) When the shape of the ball 5 detected by executing the optical shape detection program 73 is within an allowable range, the non-bonding recovery program 74 for pad is ended (step S214 in FIG. 3).

(11) When the pad non-bonding recovery routine S109 ends, the computer 31 again moves the position of the capillary 16, by the moving mechanism 18, to the pad 3 (first bonding point) (to step S102 from step S109 in FIG. 2, step (j) in FIG. 6).

(12) Then, bonding is performed again at the pad 3 (first bonding point) (step S102 in FIG. 2, step (k) in FIG. 6).

(13) When the shape of the ball is not a prescribed shape, it is determined that a pad non-bonding recovery failure on the pad has occurred, and error stop processing is performed (step S213 in FIG. 3).

As seen from the above, in the wire bonding apparatus capable of executing process by the non-bonding recovery program 74 for pad according to the First Embodiment of the present invention, after a non-bonding of pad is detected by executing the electrical non-bonding detection program 71 based upon the electrical conduction state, the condition of the non-bonding is further detected by the optical non-bonding detection program 72 and determination thereof is made, and then a non-bonding of pad is deemed to have occurred when the non-bonding is detected by both detection means. Accordingly, stoppages that result from erroneous non-bonding detection become significantly fewer in the present invention compared to the conventional wire bonding apparatuses in which non-bonding is determined and stop processing is effected only from the results of the electrical non-bonding detection means; and in the present invention, the operating ratio can be improved remarkably.

In addition, in the First Embodiment, when pad non-bonding is detected by executing the electrical non-bonding detection program 71 based on the electrical conduction state and by executing the optical non-bonding detection program 72 based on plane images, a ball is formed by effecting electrical discharge again; and the shape of the ball is detected by the optical shape detection program 73, and a determination thereof is made; and then if a prescribed shape has been realized, the process returns to the pad 3 (first bonding point), redoing is performed, and bonding action is continued. Thus, the process executed by the non-bonding recovery program 74 for pad is executed assuredly; and such a benefit is realized that bonding action can be continued without an operator having, due to the occurrence of pad non-bonding, to temporarily stop the wire bonding apparatus and inspect the situation. In particular, since dozens of wire bonding apparatuses are generally operated simultaneously, the fact that the bonding action can be continued without stopping the wire bonding apparatuses by recovery processing provides a marked benefit in bringing about vastly improved equipment operating efficiencies.

Second Embodiment

In the process by the non-bonding recovery program 74 for pad of the above-described First Embodiment, after the bonding to lead 4 (second bonding point), the tail wire 8 is formed well; and no discharge anomaly occurs with the ball formation device 26. However, when a non-bonding error occurs at the pad 3 (first bonding point) in the wire bonding apparatus 10, there are cases that the ball is not formed into a prescribed shape by re-discharge because the shape of the tip end of the wire after non-bonding is also anomalous. In view of this, the Second Embodiment of the present invention is a processing executed by the non-bonding recovery program 74 for pad that includes the processing executed by the discharge anomaly recovery program 79. In the description below, the same symbols are used for the steps that are the same as for the processing executed by the non-bonding recovery program 74 for pad described above, and no further description will be given to them.

Figure 7:
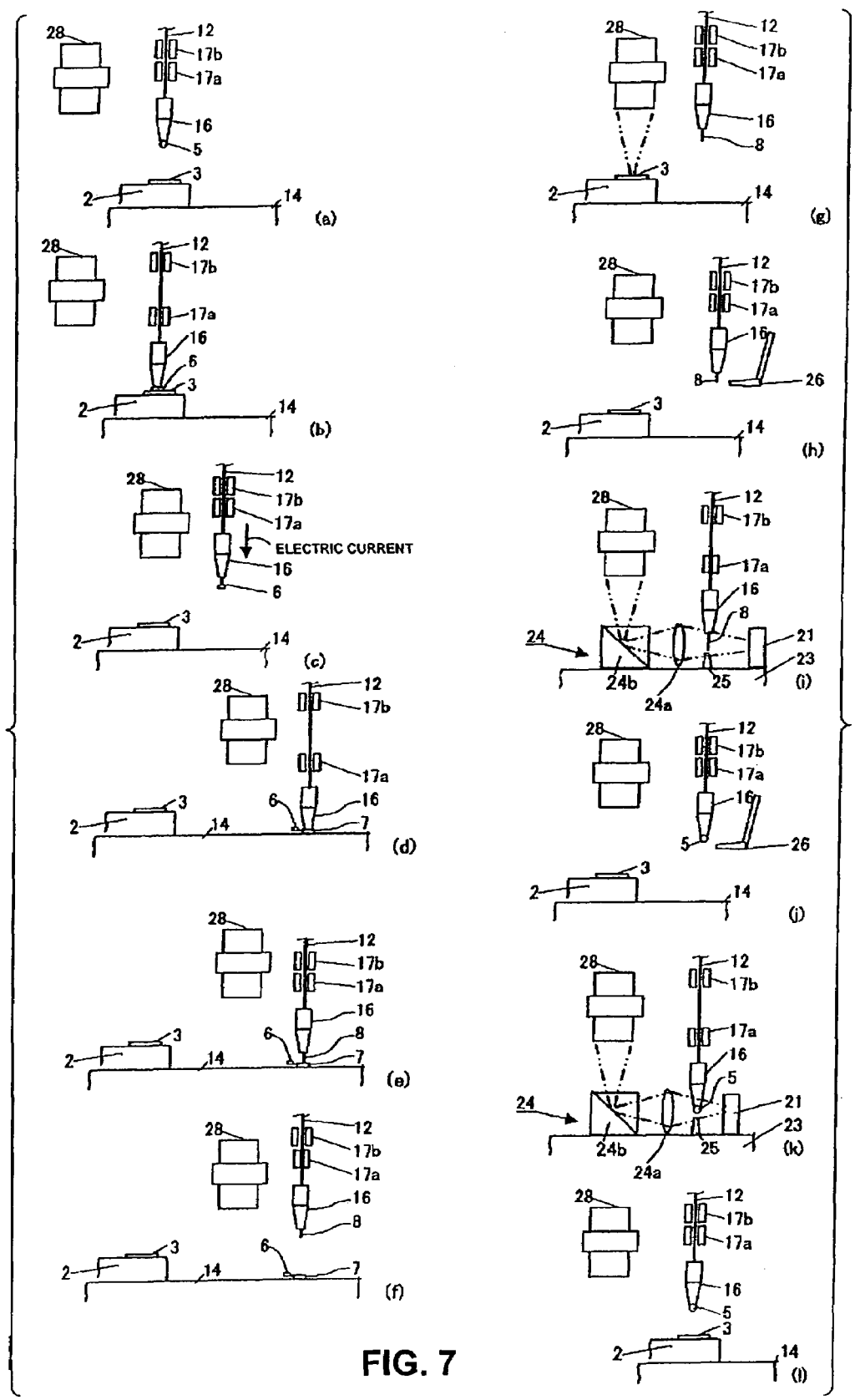
FIG. 7 shows the steps (a) to (l) of the pad non-bonding recovery process including a discharge anomaly recovery process in the present invention.

(1) In like manner as in the above-described process executed by the non-bonding recovery program 74 for pad, after non-bonding is detected for the pad 3 (first bonding point) by executing the electrical non-bonding detection program 71 by a signal from the electrical conduction state acquisition device 22 when bonding is made to the pad 3 (first bonding point) (S101 to S105 to S108 in FIG. 2), the step advances to the process (S109) executed by the non-bonding recovery program 74 for pad; and, when non-bonding for the pad 3 (first bonding point) is detected by executing the optical non-bonding detection program 72, in like manner as in the above-described process executed by the non-bonding recovery program 74 for pad, the capillary 16 is moved to the discharge position, and the ball 5 is reformed by the ball formation device 26 (steps S201 to S207 in FIG. 3, steps (a) to (h) in FIG. 7).

(2) However, when a good tail wire 8 is not formed, or the length of the tail wire 8 is shorter than the prescribed length (steps (e) and (f) in FIG. 7) as a result of the processing step(s) of bonding to the lead 4 (second bonding point), the distance between the electrode of the ball formation device 26 and the tail wire 8 is too long, and prescribed electrical discharge cannot be effected, and thus the ball will not be formed well. Electrical discharge anomalies can be detected by executing the discharge anomaly electrical detection program that fetches data from the electrical discharge state acquisition device 29 by the electrical discharge state interface 50 into the control section 30 and process those data.

(3) When a discharge anomaly is detected by executing the discharge anomaly electrical detection program, the computer 31 moves the tip end of the capillary 16, by the moving mechanism 18, to the elevation image acquisition position where the light path device 24 is provided (step S215 in FIG. 3).

(4) At the elevation image acquisition position, in like processing as in the above-described non-bonding recovery program 74 for pad, an elevation image of the tip end of the capillary 16 is captured, and the imaging device 28 inputs that elevation image of the tip end of the capillary 16 into the control section 30 via the imaging device interface 40 (step S216 in FIG. 3, step (i) in FIG. 7). The input elevation image is processed by executing the optical shape detection program 73 of the computer 31, and the conditions of the tail wire at the tip end of the capillary 16, such as length, inclination, and bend, are acquired (step S216 in FIG. 3). The acquired elevation image includes the capillary 16, tail wire 8, and reference member 25 in the visual field 62, as shown in FIGS. 11A to 11C. The computer 31 finds the length and inclination of and the degree of bend in the tail wire 8, by executing the optical shape detection program. Then, the shape of the tail wire 8 acquired is compared with reference data stored in the memory unit 34 and; when that is not a prescribed shape, then a processing S218 for paying out the wire 12 in the tip end of the capillary 16 is executed by the tail re-payout program 75 (steps S217 and S218 in FIG. 3, FIG. 7(*i*)).

Figure 5:
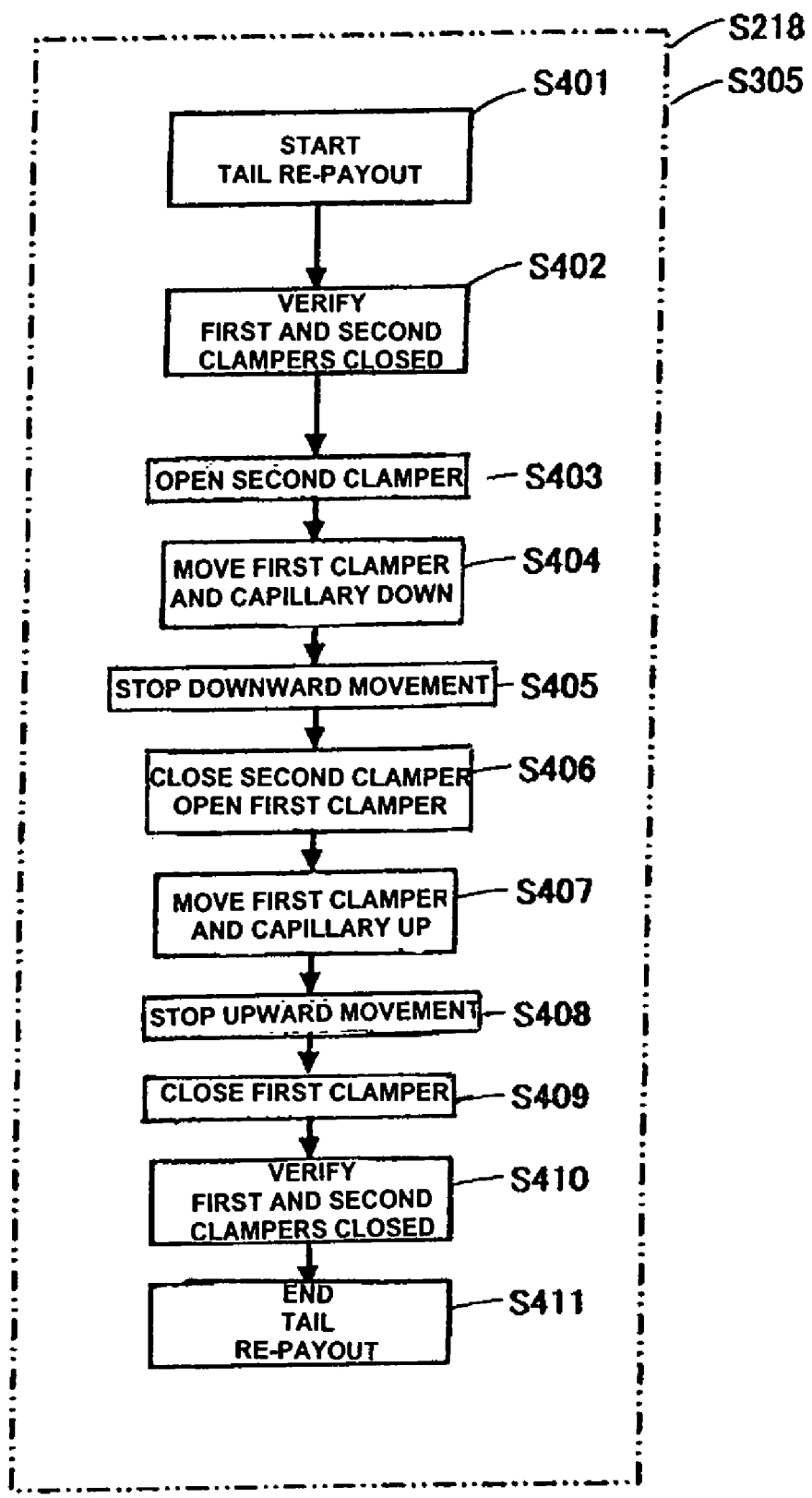
FIG. 5 is a flowchart of the tail re-payout process in the present invention.
Figure 9:
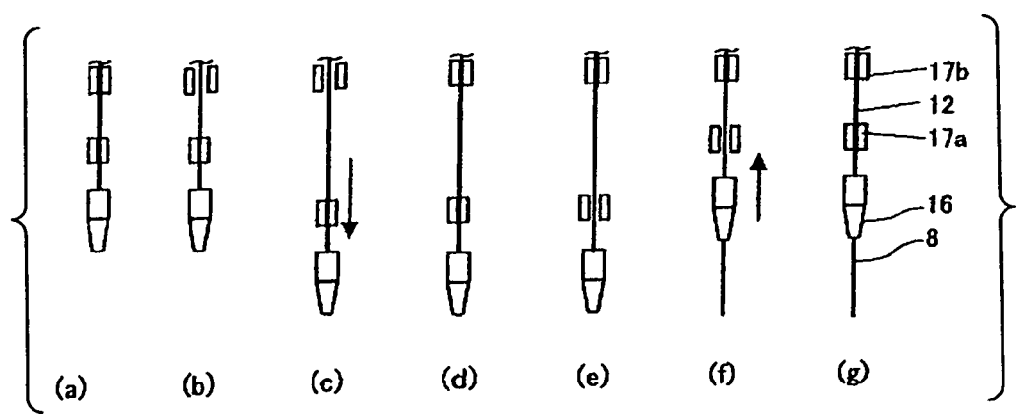
FIG. 9 shows the steps (a) to (g) of the tail re-payout process in the present invention.

(5) The processing S218 executed by the tail re-payout program 75, as shown in FIG. 5 and FIG. 9, is conducted by the opening and closing action of the two (first and second) clampers 17*a* and 17*b*, and the up-and-down movement of the capillary 16 and the first clamper 17*a*. The opening and closing actions of the clampers are effected by the input of signals from the control section 30 to the clamper operating device 27 via the clamper open/close interface 48. The processing S218 executed by the tail re-payout program 75 will be described below.

(a) Verification is made that both the first clamper 17*a* and the second clamper 17*b* are in a closed condition (step S402 in FIG. 5, FIG. 9(*a*)).

(b) The second clamper 17*b* is opened (step S403 in FIG. 5, step (b) in FIG. 9).

(c) The wire 12, while being clamped by the first clamper 17*a*, is made to descend together with the capillary, and stopped at a prescribed position (step S404 in FIG. 5, steps (c) to (d) in FIG. 9). By this action, the first clamper 17*a* pulls out the wire 12 wound on the spool 11.

(d) The second clamper 17*b* is closed, and the first clamper 17*a* is opened (S406 in FIG. 5, step (e) in FIG. 9).

(e) In this condition, the capillary 16 and the first clamper 17*a* are made to ascend. When the ascending is done, since the wire 12 is secured by the second clamper 17*b*, the wire comes jumping out at the tip end of the capillary 16 (step S407 in FIG. 5, step (f) FIG. 9).

(f) Once the capillary 16 and the first clamper 17*a* have returned to their prescribed positions, the first clamper 17*a* is closed, and verification is made that the first and second clampers 17*a* and 17*b* are closed (steps S409 and S410 in FIG. 5, step (g) in FIG. 9). The processing S218 executed by tail re-payout program 75 does not pay out the wire one time so that it attains the prescribed length, but rather repeatedly, some number of times, pays out a little at a time. Every time a wire pay-out is made, the wire length paid out at the tip end of the capillary is detected and measured by the optical shape detection program 73; and, once it is determined that the prescribed length and shape have been attained, then the processing S218 executed by the tail re-payout program 75 is ended (steps S218 to S220 in FIG. 3).

(6) When the tail wire 8 attains the prescribed condition by the processing S218 executed by the tail re-payout program 75, the computer 31 moves the capillary 16, by the moving mechanism 18, to the discharge position (steps S220 to S206 in FIG. 3, step G) in FIG. 7).

(7) Once the movement to the discharge position is made, as in the earlier electrical discharge step, electrical discharge is effected between the discharge electrode of the ball formation device 26 and the tail wire 8, and, as a result, the tip end of the tail wire 8 is formed into a ball shape. When the electrical discharge is effected well, and no discharge anomaly is detected by executing the discharge anomaly electrical detection program 78, then the computer 31 moves the imaging device 28, by the moving mechanism 18, to the elevation image acquisition position and acquires an elevation image of the ball 5, and whether or not the ball shape is the prescribed shape is detected by executing the optical shape detection program 73 (steps S209 to S212 in FIG. 3, steps (j) and (k) in FIG. 7).

(8) When the prescribed ball shape is attained, the processing executed by the non-bonding recovery program 74 for pad containing the processing executed by the discharge anomaly recovery program 79 ends (step S214 in FIG. 3).

(9) When the processing executed by the non-bonding recovery program 74 for pad ends, the computer 31 again moves the position of the capillary 16, by the moving mechanism 18, to the pad 3 (first bonding point) (steps S109 to S102 in FIG. 2, step (1) in FIG. 7).

(10) Then, bonding is performed again at the pad 3 (first bonding point) (step S102 in FIG. 2, step (b) in FIG. 7).

(11) When the shape of the ball is not a prescribed shape, it is determined that failure of non-bonding recovery for pad has occurred, and error stop processing is performed (step S213 in FIG. 3). At that time, the ball shape is determined, and, until the ball is formed into the prescribed shape, provision can be made so that tail re-payout program 75 is executed again while verifying the shape by executing the optical shape detection program 73, effecting re-discharge and taking the recovery cycle, or, alternatively, error stop processing can be done after executing such processing some number of times.

As seen from the above, in the Second Embodiment of the present invention, even when the prescribed ball is not formed due to a discharge anomaly during the processing executed by the non-bonding recovery program 74 for pad, bonding actions can be continued by performing the processing executed by the discharge anomaly recovery program 79 which is done by detecting the tail wire with an execution of the optical shape detection program 73 that determines the condition of the tail wire based on the elevation image thereof, by performing the process executed by the tail re-payout program 75 so that a prescribed ball can be formed, and then by executing re-discharging to form a ball. From this fact, compared to the recovery processing that simply entails only the ball formation processing by re-discharge when a non-bonding situation occurs as described earlier for the First Embodiment, tail re-payout and ball formation are conducted more appropriately in the Second Embodiment, and thus the recovery process can be performed in more diverse error conditions. As a consequence, bonding action can be continued without stopping the bonding action even better than the First Embodiment described earlier. In particular, this benefit is manifested more conspicuously when greater numbers of wire bonding apparatuses are operated simultaneously.

Third Embodiment

Next, the Third Embodiment of the present invention that is for a recovery processing when a no-tail is detected at the lead 4 (second bonding point) will be described. In the following description, the same symbols are used for portions that are the same as those in the non-bonding recovery processing for pad, recovery processing during discharge, and the processing executed by the tail re-payout program 75 that are described above, and no further description will be given thereto.

Figure 4:
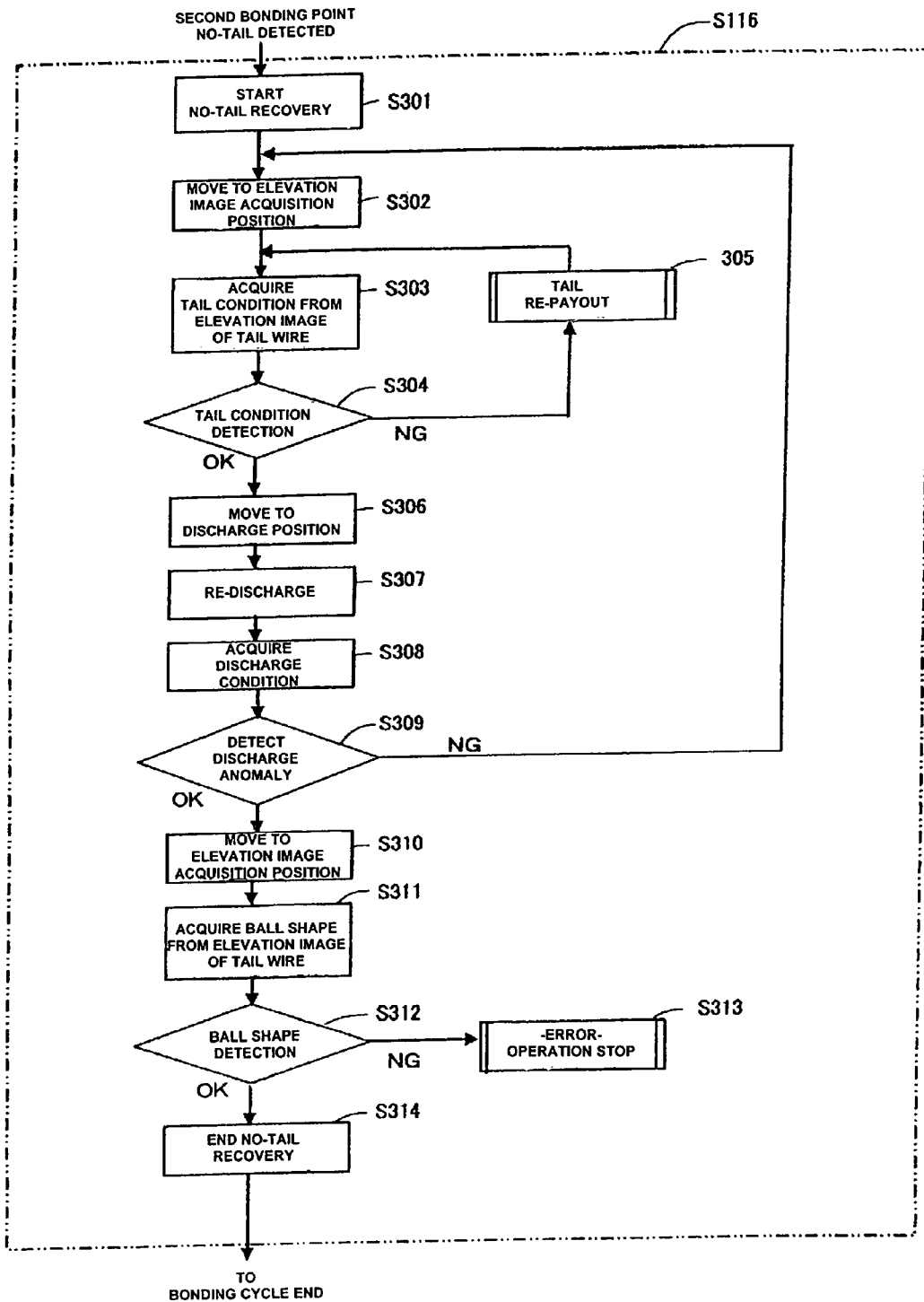
FIG. 4 is a flowchart of the no-tail recovery process in the present invention.

(1) As in the above-described processing executed by the non-bonding recovery program 74 for pad, when no non-bonding is detected for the pad 3 (first bonding point) by executing the electrical non-bonding detection program by signals from the electrical conduction state acquisition device 22 when bonding to the pad 3 (first bonding point), bonding to the pad 3 (first bonding point) is deemed to have been done well and bonding is performed to the lead 4 (second bonding point). After bonding to the lead 4 (second bonding point), electrical conduction state signals are acquired by the electrical conduction state acquisition device 22 during the ascent of the capillary 16 prior to wire cutting, and after the wire cutting action. Thereafter, no-tail detection is made by processing S115 executed by the electrical no-tail detection program 76 from an electrical conduction state signal prior to wire cutting. When a no-tail is detected, the computer 31, as shown in FIG. 4, outputs a command to start the processing S116 executed by the no-tail recovery program 77 (steps S10 to S115 in FIG. 2, steps (a) to (c) in FIG. 8). More specifically, the electrical conduction state acquisition device 22 involves resistance or impedance (not shown) therein, and the electrical no-tail detection program 76 causes the control section 30 to compare A/D-converted data with no-tail reference data stored in advance in the memory unit 34; and when the A/D-converted data is out of the range of the no-tail reference data, then the electrical no-tail detection program 76 determines the no-tail. The above-described A/D-converted data is obtained by the electrical conduction state acquisition device 22 that applies direct voltage or alternate current from the wire to the work immediately before tail cutting, and converts the difference in the electrical potentials generated, relatively, in the resistance or impedance and then A/D-converts the difference in the electrical potentials into an A/D-converted data via the electrical conduction state acquisition device interface 42.

Figure 8:
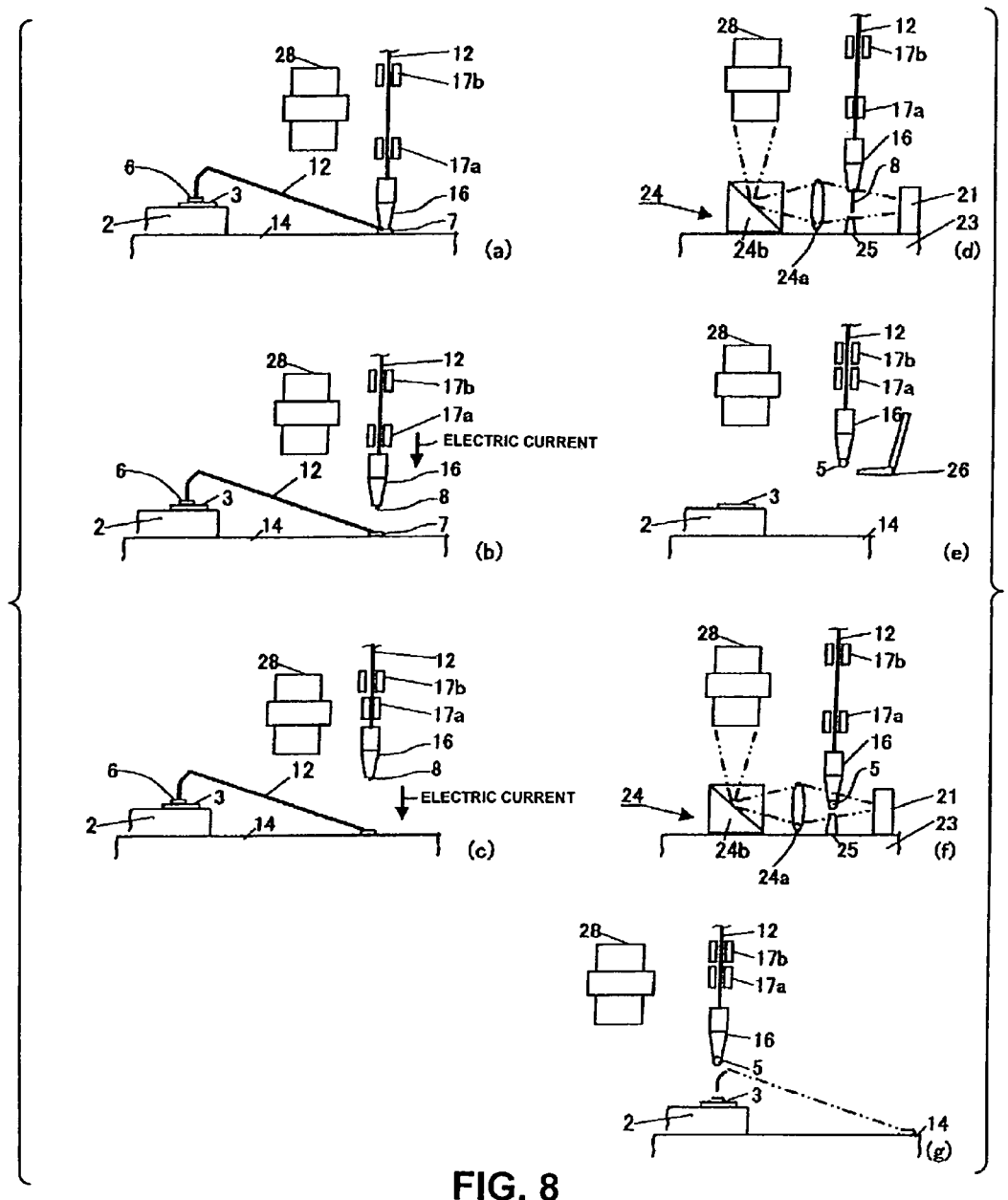
FIG. 8 shows the steps (a) to (g) of the no-tail recovery process in the present invention.

(2) When the processing S116 executed by the no-tail recovery program 77 is started, the computer 31 moves the tip end of the capillary 16, by the moving mechanism 18, to the elevation image acquisition position where the light path device 24 is provided and acquires an elevation image in the vicinity of the tip end of the capillary (steps S302 and S303 in FIG. 4, step (d) in FIG. 8).

(3) At the elevation image acquisition position, as with the processing executed by the non-bonding recovery program 74 for pad including the processing executed by the discharge anomaly recovery program 79 described earlier, an elevation image of the tip end of the capillary 16 is captured and input to the control section 30 via the imaging device interface 40. The input elevation image is processed in the control section 30, and the conditions of the tail wire at the tip end of the capillary 16, such as length, inclination, and bend, are acquired by executing the optical shape detection program 73 (step S304 in FIG. 4).

(4) When the condition of the tail wire 8 acquired is not a prescribed condition, then the processing S305 described earlier is executed by the tail re-payout program 75, while detecting the shape of the tail wire 8 by executing the optical shape detection program 73, until the shape of the tail wire 8 attains the prescribed shape (step S305 in FIG. 4, step (d) in FIG. 8).

(5) When the tail wire 8 attains the prescribed condition by the processing S305 executed by the tail re-payout program 75, the computer 31 moves the capillary 16, by the moving mechanism 18, to the discharge position (step S306 in FIG. 4, step (e) in FIG. 8).

(6) Once the move to the discharge position is done, as in the earlier electrical discharge step, electrical discharge is effected and, as a result, the tip end of the tail wire 8 is formed into a ball shape. When electrical discharge is performed well, and no discharge anomaly is detected by executing the discharge anomaly electrical detection program 78, then the computer 31 effects movement of the imaging device 28 to the elevation image acquisition position, by the moving mechanism 18, and acquires an elevation image of the ball 5; and whether or not the ball shape has attained the prescribed shape is detected by executing the optical shape detection program 73 (steps S309 to S312 in FIG. 4, step (f) in FIG. 8).

(7) When the prescribed ball shape is attained, the processing executed by the no-tail recovery program 77 ends (step S314 in FIG. 4).

(8) When the processing executed by the no-tail recovery program 77 ends, the bonding cycle ends (steps S116 to S19 in FIG. 2).

(9) The computer 31 moves the position of the capillary 16, by the moving mechanism 18, to the next pad 3 (first bonding point), and continues the next bonding action.

(10) When the shape of the ball has not attained the prescribed shape, it is determined that a no-tail recovery failure has occurred, and error stop processing is performed (step S313 in FIG. 4). At this time, the ball shape is determined, and provision can be made so that, until the ball is formed into a prescribed shape, the processing executed by the tail re-payout program 75 is done again while verifying the shape by executing the optical shape detection program 73, effecting re-discharge and go to the recovery cycle, or, alternatively, error stop processing can be done after performing such processing executed by such programs some number of times.

As seen from the above, with the Third Embodiment of the present invention, even when a no-tail error, in which the tail wire fails to have a prescribed length, has occurred at the position of the lead 4 (second bonding point), such no-tail error is detected by executing the optical shape detection program that determines the condition of that tail wire by the elevation image, and a no-tail error recovery is effected by performing the processing executed by the tail re-payout program 75 and then re-discharging so that a prescribed ball formation becomes possible, thus forming a ball, and then continuing the bonding actions. Accordingly, combined to the non-bonding recovery program for pad described earlier for the First and Second Embodiments, even more diverse error conditions can be coped with in the Third Embodiment, and bonding action can be continued without stopping the bonding action. In particular, this benefit is manifested more conspicuously when greater numbers of wire bonding apparatuses are operated simultaneously.

The invention claimed is:

1. A wire bonding apparatus comprising:
   a moving mechanism for moving, in XYZ directions, a capillary having a wire inserted therethrough and executing bonding on a work;
   an electrical conduction state acquisition device for detecting an electrical conduction state by allowing an electric current to flow from the wire to the work;
   a first means for taking an image of the work;
   a light path device for conducting an elevation image of a vicinity of a tip end of the capillary to the first means;
   a ball formation device for forming a tip end of the wire into a ball of a prescribed shape; and
   a computer for controlling wire bonding between a first bonding point and a second bonding point, said computer including
     a second means for electrically detecting non-bonding between the first bonding point and the wire by processing electrical conduction state signals acquired by the electrical conduction state acquisition device and indicative of electrical conduction state between the first bonding point and the wire,
     a third means for optically detecting non-bonding between the first bonding point and the wire by processing plane images acquired by the first means,
     a fourth means for detecting a shape of a tip end of the wire by processing elevation images of the wire in the vicinity of the tip end of the capillary acquired by said first means via the light path device, and
     a fifth means for, when non-bonding is detected by the second means and non-bonding is detected by the third means, reforming the tip end of the wire into a ball of prescribed shape by the ball formation device, based on the tip end shape of the wire detected by the fourth means, and executing rebonding on the first bonding point.

2. The wire bonding apparatus according to claim 1, said wire bonding apparatus further comprising a sixth means for opening and closing a plurality of clampers, respectively, for gripping the wire; and
   said computer further comprising a seventh means for, when non-bonding is detected by the second means and non-bonding is detected by the third means and a condition of the wire, which is at the tip end of the capillary and detected by the fourth means, is not a prescribed condition, paying out the wire at the tip end of the capillary until the wire at the tip end of the capillary attains a prescribed condition, by an up-and-down movement of the capillary caused by the sixth means and moving mechanism, based on a condition of the wire at the tip end of the capillary detected by the fourth means.

3. A record medium storing a bonding control program for a wire bonding apparatus for bonding a wire between a first bonding point and a second boding point, said wire bonding apparatus including
   a moving mechanism for moving, in XYZ directions, a capillary having a wire inserted therethrough and executing bonding on a work,
   an electrical conduction state acquisition device for detecting an electrical conduction state by allowing an electric current to flow from the wire to the work,
   a light path device for conducting an elevation image of a vicinity of a tip end of the capillary to an imaging device,
   a ball formation device for forming a tip end of the wire into a ball of a prescribed shape, and a computer for controlling said wire bonding apparatus;
said record medium storing a bonding control program executed by said computer, comprising:
an electrical non-bonding detection program for electrically detecting non-bonding between the first bonding point and the wire by processing electrical conduction state signals acquired by the electrical conduction state acquisition device and indicative of electrical conduction state between a first bonding point and a wire;
an optical non-bonding detection program for optically detecting non-bonding between a first bonding point and a wire by processing plane images acquired by the imaging device;
an optical shape detection program for detecting a shape of a tip end of the wire by processing elevation images of the wire in the vicinity of the tip end of the capillary acquired by the imaging device via the light path device; and
a non-bonding recovery program for, when a non-bonding detection is output by the electrical non-bonding detection program and a non-bonding detection is output by the optical non-bonding detection program, reforming a ball of a prescribed shape at the tip end of the wire by the ball formation device based on the tip end shape of the wire output by the optical shape detection program, and executing rebonding at the first bonding point.

4. The record medium storing a bonding control program according to claim 3,
said wire bonding apparatus, controlled by said wire bonding program, further comprising a clamper operating device for opening and closing a plurality of clampers, respectively, for gripping the wire; and
said record medium storing a bonding control program further comprising a tail re-payout program for, when a non-bonding detection is output by the electrical non-bonding detection program and a non-bonding detection is output by the optical non-bonding detection program and an output is made by the optical shape detection program to the effect that a condition of the wire at the tip end of the capillary is not a prescribed condition, paying out the wire at the tip end of the capillary until the wire at the tip end of the capillary attains a prescribed condition, by an up-and-down movement of the capillary caused by the clamper operating device and moving mechanism, based on a condition of the wire at the tip end of the capillary output by the optical shape detection program.

5. A bonding method for a bonding apparatus for bonding a wire between a first bonding point and a second bonding point, comprising the steps of:
preparing
a moving mechanism for moving, in XYZ directions, a capillary having a wire inserted therethrough and executing bonding on a work,
an electrical conduction state acquisition device for detecting an electrical conduction state by allowing an electric current to flow from the wire to the work,
an imaging device for taking an image of the work,
a light path device for conducting an elevation image of a vicinity of a tip end of the capillary to the imaging device,
a ball formation device for forming the tip end of the wire into a ball of a prescribed shape, and
a computer for controlling said bonding apparatus;
an electrical non-bonding detection step for electrically detecting non-bonding between the first bonding point and the wire by processing electrical conduction state signals acquired by said electrical conduction state acquisition device and indicative of electrical conduction state between the first bonding point and the wire;
an optical non-bonding detection step for optically detecting non-bonding between the first bonding point and the wire by processing plane images acquired by said imaging device;
an optical shape detection step for detecting a shape of a tip end of the wire by processing elevation images of the wire in the vicinity of the tip end of the capillary acquired by said imaging device via said light path device; and
a non-bonding recovery step for, when non-bonding is detected in the electrical non-bonding detection step and non-bonding is detected in the optical non-bonding detection step, reforming the tip end of the wire into a ball of a prescribed shape by said ball formation device, based on the tip end shape of the wire detected in the optical shape detection step, and executing rebonding on the first bonding point.

6. The bonding method according to claim 5,
said wire bonding apparatus in which said bonding method is employed further comprising a clamper operating device for opening and closing a plurality of clampers, respectively, for gripping the wire; and
said bonding method further comprising a tail re-payout step for, when non-bonding is detected in the electrical non-bonding detection step and non-bonding is detected in the optical non-bonding detection step and a condition of the wire at the tip end of the capillary detected in the optical shape detection step is not a prescribed condition, paying out the wire at the tip end of the capillary until the wire at the tip end of the capillary attains a prescribed condition by an up-and-down movement of the capillary caused by the clamper operating device and moving mechanism based on a condition of the wire at the tip end of the capillary detected in the optical shape detection step.

* * * * *